(12) United States Patent
Lee et al.

(10) Patent No.: US 11,874,705 B2
(45) Date of Patent: Jan. 16, 2024

(54) DISPLAY DEVICE

(71) Applicant: LG Display Co., Ltd., Seoul (KR)

(72) Inventors: Mose Lee, Bucheon-si (KR); Yongmin Jeong, Seoul (KR); Dongho Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/982,303

(22) Filed: Nov. 7, 2022

(65) Prior Publication Data

US 2023/0213975 A1 Jul. 6, 2023

(30) Foreign Application Priority Data

Dec. 30, 2021 (KR) .................. 10-2021-0193487

(51) Int. Cl.
| | |
|---|---|
| *G06F 1/16* | (2006.01) |
| *H01L 27/12* | (2006.01) |
| *H01L 25/16* | (2023.01) |
| *G09G 3/3233* | (2016.01) |
| *G09G 3/00* | (2006.01) |
| *H10K 77/10* | (2023.01) |
| *H01L 23/00* | (2006.01) |

(52) U.S. Cl.
CPC ........... *G06F 1/1652* (2013.01); *G09G 3/035* (2020.08); *G09G 3/3233* (2013.01); *H01L 25/167* (2013.01); *H01L 27/1244* (2013.01); *H10K 77/10* (2023.02); *G09G 2300/0426* (2013.01); *G09G 2300/0842* (2013.01); *G09G 2300/0861* (2013.01); *H01L 24/29* (2013.01); *H01L 24/32* (2013.01); *H01L 24/83* (2013.01); *H01L 2224/29021* (2013.01); *H01L 2224/32147* (2013.01); *H01L 2224/83201* (2013.01); *H01L 2224/83851* (2013.01)

(58) Field of Classification Search
CPC .......... G06F 1/1652; G06F 3/041–047; G06F 2203/041–04114; G06F 1/1641; G09G 2380/02; G09G 2300/0426; G09G 3/3208; G09G 2380/00; G09F 9/301; H10K 59/00–95; H10K 59/131; H10K 77/111; H10K 2102/311; H10K 59/179; H10K 59/127; H10K 59/1213
See application file for complete search history.

(56) References Cited

U.S. PATENT DOCUMENTS

2019/0280077 A1* 9/2019 Park .................. H10K 59/1213
2021/0126172 A1* 4/2021 Eom .................. H01L 27/1214

* cited by examiner

*Primary Examiner* — Sanjiv D. Patel
(74) *Attorney, Agent, or Firm* — Seed IP Law Group LLP

(57) ABSTRACT

A display device according to an example embodiment of the present disclosure may include a stretchable lower substrate; a lower pattern layer disposed on the lower substrate and including a plurality of lower plate patterns and a plurality of lower line patterns; a plurality of pixel circuits disposed on each of the plurality of lower plate patterns; a plurality of lower stretched lines disposed on each of the plurality of lower line patterns; an upper pattern layer disposed on the lower pattern layer and including a plurality of upper plate patterns and a plurality of upper line patterns; a plurality of light emitting elements disposed on each of the plurality of upper plate patterns; and a plurality of upper stretched lines disposed on each of the plurality of upper line patterns, so that a uniform power may be supplied.

20 Claims, 18 Drawing Sheets

DISPLAY DEVICE

CROSS-REFERENCE TO RELATED APPLICATIONS

This application claims the benefit of and priority to Korean Patent Application No. 10-2021-0193487, filed on Dec. 30, 2021, in the Republic of Korea, which is herein incorporated by reference in its entirety.

BACKGROUND

Technical Field

The present disclosure relates to a display device, and more particularly, to a stretchable display device.

Description of the Related Art

Display devices used for a computer monitor, a TV, a mobile phone, and the like include an organic light emitting display (OLED) that emits light by itself, a liquid-crystal display (LCD) that requires a separate light source, and the like.

Such display devices are being applied to more and more various fields including not only a computer monitor and a TV, but personal mobile devices, and thus, display devices having a reduced volume and weight while having a wide active area are being studied.

Recently, a display device manufactured to be stretchable in a specific direction and changeable into various shapes by forming a display unit, lines, and the like on a flexible substrate such as plastic that is a flexible material has received considerable attention as a next-generation display device.

BRIEF SUMMARY

An aspect of the present disclosure is to provide a display device allowing connection lines to be disposed on different planes.

Another aspect of the present disclosure is to provide a display device in which a line resistance of stretched lines is minimized.

Still another aspect of the present disclosure is to provide a display device in which connection lines can transmit various signals.

Objects of the present disclosure are not limited to the above-mentioned objects, and other objects, which are not mentioned above, can be clearly understood by those skilled in the art from the following descriptions.

A display device according to an example embodiment of the present disclosure may include a stretchable lower substrate; a lower pattern layer disposed on the lower substrate and including a plurality of lower plate patterns and a plurality of lower line patterns; a plurality of pixel circuits disposed on each of the plurality of lower plate patterns; a plurality of lower stretched lines disposed on each of the plurality of lower line patterns; an upper pattern layer disposed on the lower pattern layer and including a plurality of upper plate patterns and a plurality of upper line patterns; a plurality of light emitting elements disposed on each of the plurality of upper plate patterns; and a plurality of upper stretched lines disposed on each of the plurality of upper line patterns, so that a uniform power may be supplied.

Other detailed matters of the example embodiments are included in the detailed description and the drawings.

According to the present disclosure, it is possible to ensure a larger gap between stretched lines, so that stretching reliability can be improved.

According to the present disclosure, it is possible to achieve uniformity of an image by reducing variations in high potential voltage.

According to the present disclosure, a line resistance of the stretched lines is reduced, so that a signal delay of a gate signal and a data voltage can be minimized.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings.

DETAILED DESCRIPTION

Figure 1:
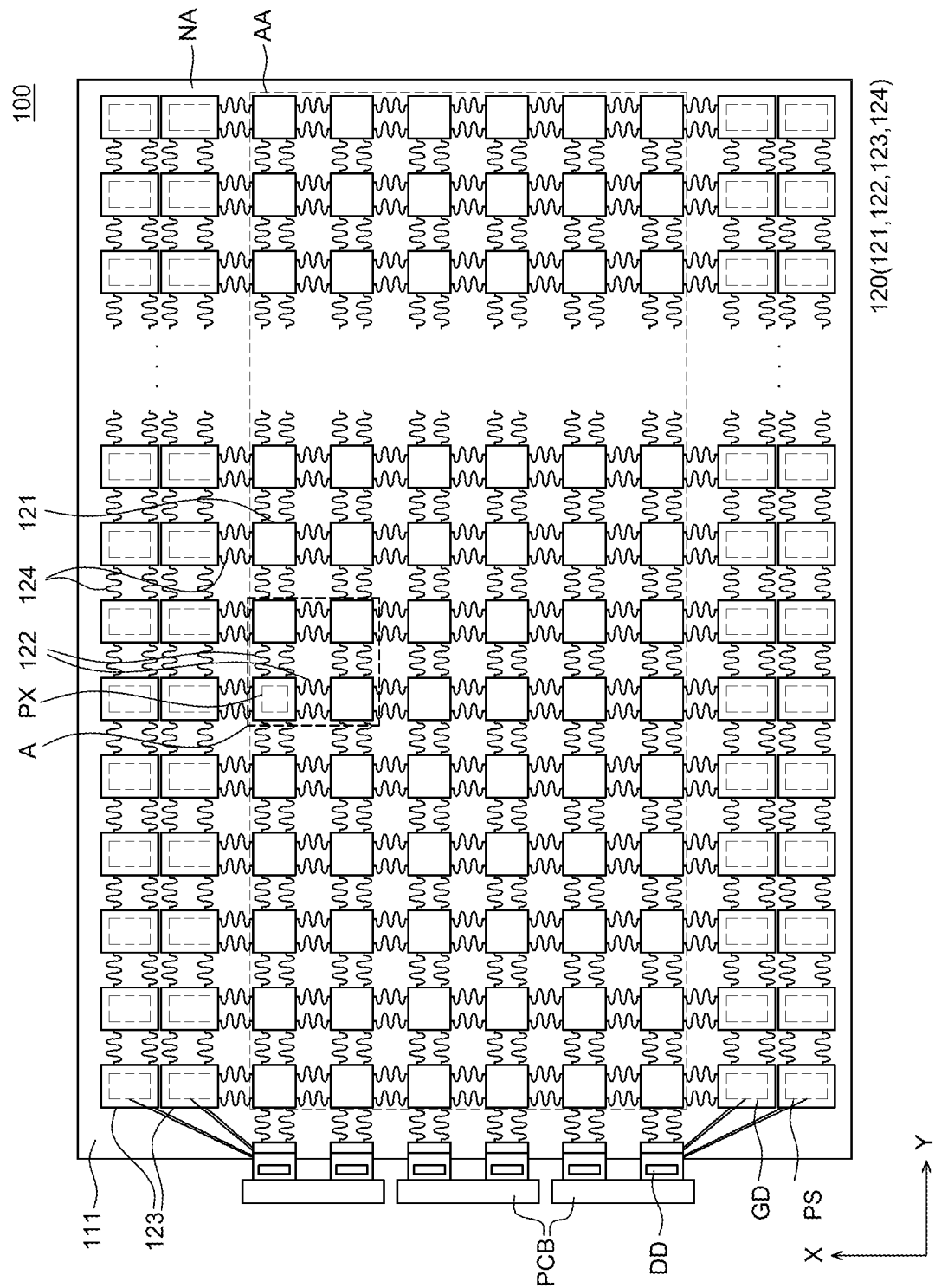
FIG. 1 is a plan view of a display device according to an example embodiment of the present disclosure.

The advantages and features of the present disclosure, and methods for accomplishing the same will be more clearly understood from example embodiments described below with reference to the accompanying drawings. However, the present disclosure is not limited to the following example embodiments but may be implemented in various different forms. The exemplary embodiments are provided only to complete disclosure of the present disclosure and to fully provide a person with ordinary skill in the art to which the present disclosure pertains with the category of the present disclosure.

The shapes, dimensions, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is referred to as being "on" another element or layer, it may be directly on the other element or layer, or intervening elements or layers may be present.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since the dimensions and thickness of each component illustrated in the drawings are represented for convenience in explanation, the present disclosure is not necessarily limited to the illustrated dimensions and thickness of each component.

The features of various embodiments of the present disclosure can be partially or entirely coupled to or combined with each other and can be interlocked and operated in technically various ways, and the embodiments can be carried out independently of or in association with each other.

Hereinafter, various example embodiments of the present disclosure will be described in detail with reference to the accompanying drawings.

A display device according to an example embodiment of the present disclosure is a display device capable of displaying an image even if it is bent or stretched, and may also be referred to as a stretchable display device or a flexible display device. The display device may have higher flexibility and stretchability than conventional, typical display devices. Accordingly, a user can bend or stretch the display device, and a shape of the display device can be freely changed according to the user's manipulation. For example, when the user grabs and pulls an end of the display device, the display device may be stretched in a pulling direction by the user. If the user places the display device on an uneven outer surface, the display device can be disposed to be bent according to a shape of the outer surface. When force applied by the user is removed, the display device can return to an original shape thereof.

Stretchable Substrate and Pattern Layer

FIG. 1 is a plan view of a display device according to an example embodiment of the present disclosure.

Figure 2:
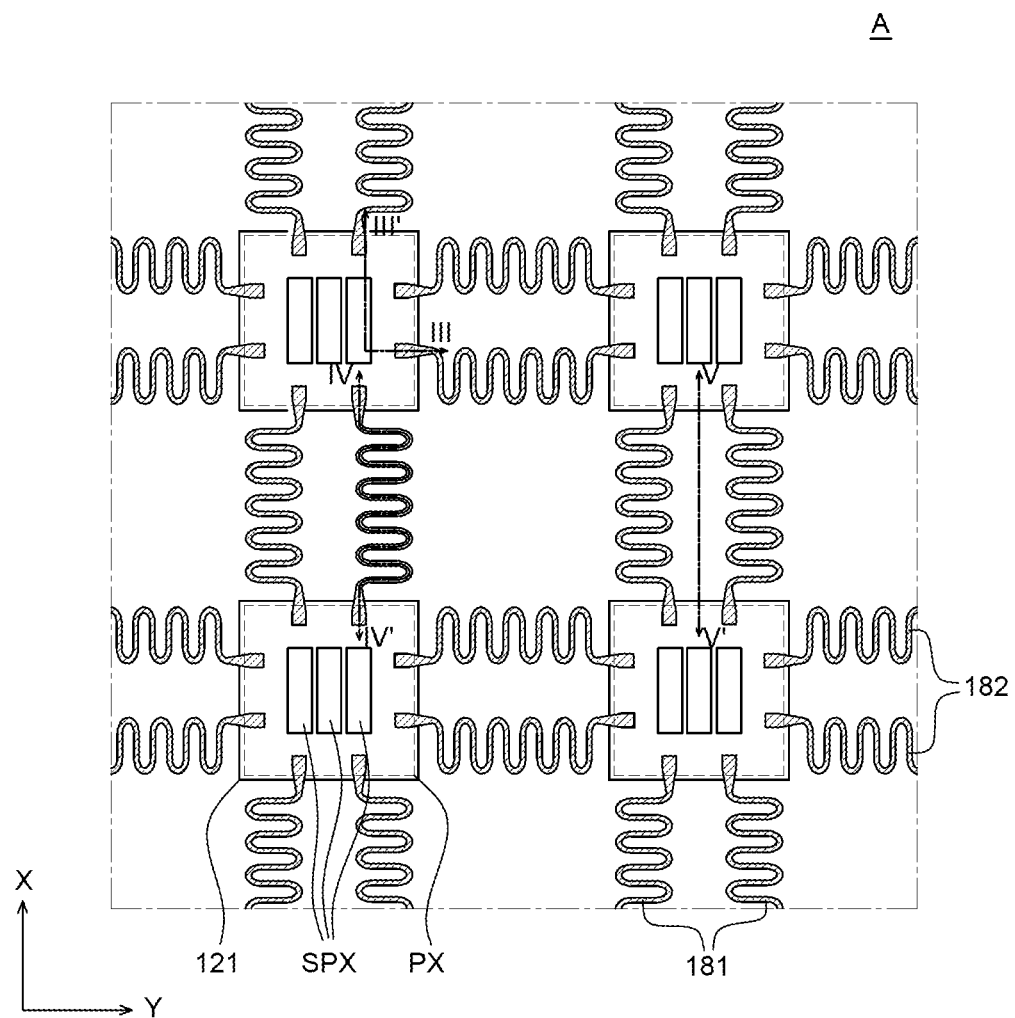
FIG. 2 is an enlarged plan view of active area of the display device according to an example embodiment of the present disclosure.

FIG. 2 is an enlarged plan view of an active area of the display device according to an example embodiment of the present disclosure.

Figure 3:
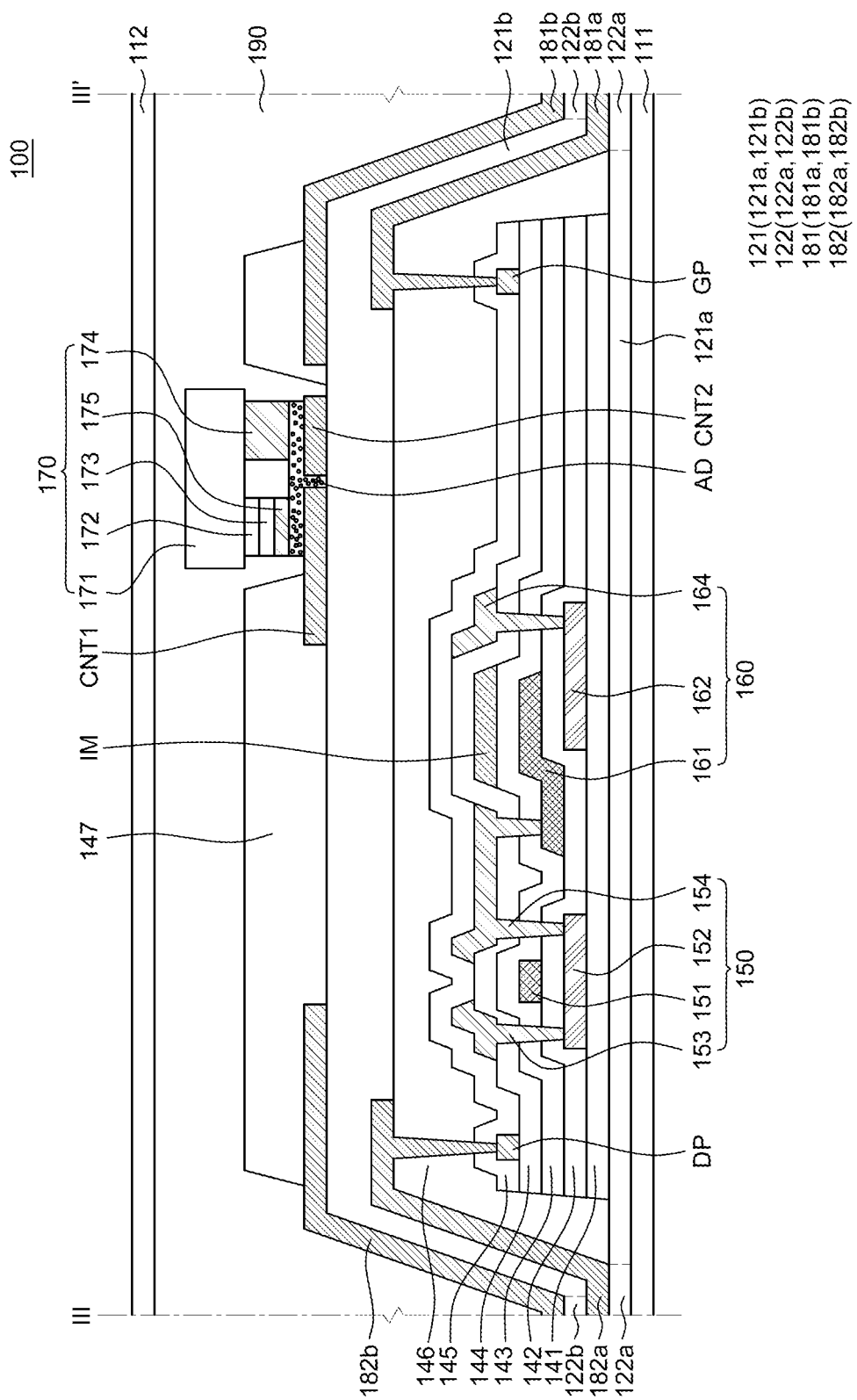
FIG. 3 is a cross-sectional view taken along cutting line shown in FIG. 2.

FIG. 3 is a cross-sectional view taken along cutting line shown in FIG. 2.

Specifically, FIG. 2 is an enlarged plan view of area A shown in FIG. 1.

Referring to FIG. 1, a display device 100 according to an example embodiment of the present disclosure may include a lower substrate 111, a pattern layer 120, a plurality of pixels PX, gate drivers GD, data drivers DD, and power supplies PS. And, referring to FIG. 3, the display device 100 according to an example embodiment of the present disclosure may further include a filling layer 190 and an upper substrate 112.

The lower substrate 111 is a substrate for supporting and protecting various components of the display device 100. In addition, the upper substrate 112 is a substrate for covering and protecting various components of the display device 100. That is, the lower substrate 111 is a substrate that supports the pattern layer 120 on which the pixels PX, the gate drivers GD, and the power supplies PS are formed. In addition, the upper substrate 112 is a substrate that covers the pixels PX, the gate drivers GD, and the power supplies PS.

Each of the lower substrate 111 and the upper substrate 112 is a ductile substrate and may be formed of an insulating material that can be bent or stretched. For example, each of the lower substrate 111 and the upper substrate 112 may be formed of silicone rubber such as polydimethylsiloxane (PDMS) or elastomers such as polyurethane (PU) and polytetrafluoroethylene (PTFE), and thus, may have flexible properties. In addition, materials of the lower substrate 111 and the upper substrate 112 may be the same, but are not limited thereto and may be variously modified.

Each of the lower substrate 111 and the upper substrate 112 is a ductile substrate and may be reversibly expandable and contractible. Accordingly, the lower substrate 111 may be referred to as a lower stretchable substrate, a lower flexible substrate, a lower extendable substrate, a lower ductile substrate, a first stretchable substrate, a first flexible substrate, a first extendable substrate, or a first ductile substrate, and the upper substrate 112 may be referred to as an upper stretchable substrate, an upper flexible substrate, an upper extendable substrate, an upper ductile substrate, a second stretchable substrate, a second flexible substrate, a second extendable substrate, or a second ductile substrate. Further, moduli of elasticity of the lower substrate 111 and the upper substrate 112 may be several MPa to several hundreds of MPa. Further, a ductile breaking rate of the lower substrate 111 and the upper substrate 112 may be 100% or higher. Here, the ductile breaking rate refers to a stretching rate at a time when an object to be stretched is broken or cracked. A thickness of the lower substrate may be 10 μm to 1 mm, but is not limited thereto.

The lower substrate 111 may have an active area AA and a non-active area NA surrounding the active area AA. However, the active area AA and the non-active area NA are not limited to the lower substrate 111 and may be referred throughout the display device.

The active area AA is an area in which an image is displayed on the display device 100. The plurality of pixels PX are disposed in the active area AA. In addition, each of the pixels PX may include a display element and various driving elements for driving the display element. The various driving elements may mean at least one thin film transistor TFT and a capacitor, but are not limited thereto. In addition, each of the plurality of pixels PX may be connected to various lines. For example, each of the plurality of pixels PX may be connected to various lines such as gate lines, data lines, high potential voltage lines, low potential voltage lines, reference lines and initialization voltage lines.

The non-active area NA is an area in which an image is not displayed. The non-active area NA may be an area adjacent to the active area AA. And, the non-active area NA may be an area that is adjacent to and surrounds the active area AA. However, the present disclosure is not limited thereto, and the non-active area NA corresponds to an area of the lower substrate 111 excluding the active area AA and may be changed and separated into various shapes. Components for driving the plurality of pixels PX disposed in the active area AA are disposed in the non-active area NA. The gate drivers GD and power supplies PS may be disposed in the non-active area NA. In addition, a plurality of pads that are connected to the gate drivers GD and the data drivers DD may be disposed in the non-active area NA, and each of the pads may be connected to each of the plurality of pixels PX in the active area AA.

On the lower substrate 111, the pattern layer 120 including a plurality of inner plate patterns 121 and a plurality of inner line patterns 122 that are disposed in the active area AA and a plurality of outer plate patterns 123 and a plurality of outer line patterns 124 that are disposed in the non-active area NA is disposed.

The plurality of inner plate patterns 121 may be disposed in the active area AA of the lower substrate 111. The plurality of pixels PX may be formed on the plurality of inner plate patterns 121. In addition, the plurality of outer plate patterns 123 may be disposed in the non-active area NA of the lower substrate 111. In addition, the gate drivers GD and the power supplies PS are formed on the plurality of outer plate patterns 123.

The plurality of inner plate patterns 121 and the plurality of outer plate patterns 123 as described above may be disposed in the form of islands that are spaced apart from each other. Each of the plurality of inner plate patterns 121 and the plurality of outer plate patterns 123 may be individually separated. Accordingly, the plurality of inner plate patterns 121 and the plurality of outer plate patterns 123 may be referred to as first island patterns and second island patterns, or first individual patterns and second individual patterns.

Specifically, the gate drivers GD may be mounted on the plurality of outer plate patterns 123. The gate driver GD may be formed on the outer plate pattern 123 in a gate in panel (GIP) method when various components on the inner plate pattern 121 are manufactured. Accordingly, various circuit components constituting the gate drivers GD such as various transistors, capacitors, and lines may be disposed on the plurality of outer plate patterns 123. However, the present disclosure is not limited thereto, and the gate driver GD may be mounted in a chip on film (COF) method.

In addition, the power supplies PS may be mounted on the plurality of outer plate patterns 123. The power supply PS may be formed on the outer plate pattern 123 with a plurality of power blocks that are patterned when various components on the inner plate pattern 121 are manufactured. Accordingly, the power blocks disposed on different layers may be disposed on the outer plate pattern 123. That is, a lower power block and an upper power block may be sequentially disposed on the outer plate pattern 123. In addition, a low potential voltage may be applied to the lower power block, and a high potential voltage may be applied to the upper power block. Accordingly, the low potential voltage may be supplied to the plurality of pixels PX through the lower power block. In addition, the high potential voltage may be supplied to the plurality of pixels PX through the upper power block.

Referring to FIG. 1, sizes of the plurality of outer plate patterns 123 may be greater than sizes of the plurality of inner plate patterns 121. Specifically, the size of each of the plurality of outer plate patterns 123 may be greater than the size of each of the plurality of inner plate patterns 121. As described above, the gate driver GD may be disposed on each of the plurality of outer plate patterns 123, and one stage of the gate driver GD may be disposed on each of the plurality of outer plate patterns 123. Accordingly, since an area that is occupied by various circuit components constituting one stage of the gate driver GD is relatively greater than an area occupied by the pixels PX, the size of each of the plurality of outer plate patterns 123 may be greater than the size of each of the inner plate patterns 121.

In FIG. 1, the plurality of outer plate patterns 123 are illustrated as being disposed on both sides in a first direction X in the non-active area NA, but the present disclosure is not limited thereto, and the plurality of outer plate patterns 123 may be disposed in any region of the non-active area NA. In addition, although the plurality of inner plate patterns 121 and the plurality of outer plate patterns 123 are shown in a quadrangular shape, the present disclosure is not limited thereto, and the plurality of inner plate patterns 121 and the plurality of outer plate patterns 123 are changeable in various forms.

Referring to FIGS. 1 and 3, the pattern layer 120 may further include the plurality of inner line patterns 122 disposed in the active area AA and the plurality of outer line patterns 124 disposed in the non-active area NA.

The plurality of inner line patterns 122 are patterns that are disposed in the active area AA and connect the inner plate patterns 121 adjacent to each other, and may be referred to as inner connection patterns. That is, the plurality of inner line patterns 122 are disposed between the plurality of inner plate patterns 121.

The plurality of outer line patterns 124 may be patterns that are disposed in the non-active area NA and connect the inner plate patterns 121 and the outer plate patterns 123 adjacent to each other or connect the plurality of outer plate patterns 123 adjacent to each other. Accordingly, the plurality of outer line patterns 124 may be referred to as outer connection patterns. And, the plurality of outer line patterns 124 may be disposed between the inner plate patterns 121 and the outer plate patterns 123 that are adjacent to each other, and may be disposed between the plurality of outer plate patterns 123 that are adjacent to each other. Referring to FIG. 1, the plurality of inner line patterns 122 and the plurality of outer line patterns 124 have a wavy shape. For example, the plurality of inner line patterns 122 and the plurality of outer line patterns 124 may have a sine wave shape. However, the shapes of the plurality of inner line patterns 122 and the plurality of outer line patterns 124 are not limited thereto. For example, the plurality of inner line patterns 122 and the plurality of outer line patterns 124 may extend in a zigzag manner. Alternatively, the plurality of inner line patterns 122 and the plurality of the outer line patterns 124 may have various shapes, such as shapes in which a plurality of rhombus-shaped substrates are extended by being connected at vertices thereof. In addition, the numbers and shapes of the plurality of inner line patterns 122 and the outer line patterns 124 illustrated in FIG. 1 are example, and the numbers and shapes of the plurality of inner line patterns 122 and the outer line patterns 124 may be variously changed according to design.

In addition, the plurality of inner plate patterns 121, the plurality of inner line patterns 122, the plurality of outer plate patterns 123, and the plurality of outer line patterns 124 are rigid patterns. That is, the plurality of inner plate patterns 121, the plurality of inner line patterns 122, the plurality of outer plate patterns 123, and the plurality of outer line patterns 124 may be rigid compared to the lower substrate 111 and the upper substrate 112. Accordingly, moduli of elasticity of the plurality of inner plate patterns 121, the plurality of inner line patterns 122, the plurality of outer plate patterns 123, and the plurality of outer line patterns 124 may be higher than a modulus of elasticity of the lower substrate 111. The modulus of elasticity is a parameter representing a rate of deformation against a stress applied to the substrate. When the modulus of elasticity is relatively high, hardness may be relatively high. Accordingly, the plurality of inner plate patterns 121, the plurality of inner line patterns 122, the plurality of outer plate patterns 123, and the plurality of outer line patterns 124 may be referred to as a plurality of first rigid patterns, a plurality of second rigid patterns, a plurality of third rigid patterns, and a plurality of fourth rigid patterns, respectively. The moduli of elasticity of the plurality of inner plate patterns 121, the plurality of inner line patterns 122, the plurality of outer plate patterns 123, and the plurality of outer line patterns 124 may be 1000 times higher than the moduli of elasticity of the lower substrate 111 and the upper substrate 112, but the present disclosure is not limited thereto.

The plurality of inner plate patterns 121, the plurality of inner line patterns 122, the plurality of outer plate patterns 123, and the plurality of outer line patterns 124 that are a plurality of rigid substrates may be formed of a plastic material having flexibility that is lower than that of the lower substrate 111 and the upper substrate 112. For example, the plurality of inner plate patterns 121, the plurality of inner line patterns 122, the plurality of outer plate patterns 123, and the plurality of outer line patterns 124 may be formed of at least one material among polyimide (PI), polyacrylate, and polyacetate. In this case, the plurality of inner plate patterns 121, the plurality of inner line patterns 122, the plurality of outer plate patterns 123, and the plurality of outer line patterns 124 may be formed of the same material, but they are not limited thereto and may be formed of different materials. When the plurality of inner plate patterns 121, the plurality of inner line patterns 122, the plurality of outer plate patterns 123, and the plurality of outer line patterns 124 are formed of the same material, they may be integrally formed.

In some embodiments, the lower substrate 111 may be defined as including a plurality of first lower patterns and a second lower pattern. The plurality of first lower patterns may be areas of the lower substrate 111 that overlap the plurality of inner plate patterns 121 and the plurality of outer plate patterns 123. The second lower pattern may be an area of the lower substrate 111 that does not overlap the plurality of inner plate patterns 121 and the plurality of outer plate patterns 123.

Also, the upper substrate 112 may be defined as including a plurality of first upper patterns and a second upper pattern. The plurality of first upper patterns may be areas of the upper substrate 112 that overlap the plurality of inner plate patterns 121 and the plurality of outer plate patterns 123, and the second upper pattern may be an area of the upper substrate 112 that does not overlap the plurality of inner plate patterns 121 and the plurality of outer plate patterns 123.

In this case, moduli of elasticity of the plurality of first lower patterns and first upper patterns may be greater than moduli of elasticity of the second lower patterns and the second upper patterns. For example, the plurality of first lower patterns and the first upper patterns may be formed of the same material as the plurality of inner plate patterns 121 and the plurality of outer plate patterns 123, and the second lower pattern and the second upper pattern may be formed of a material having a modulus of elasticity lower than those of the plurality of inner plate patterns 121 and the plurality of outer plate patterns 123.

That is, the first lower pattern and the first upper pattern may be formed of polyimide (PI), polyacrylate, polyacetate, or the like and the second lower pattern and the second upper pattern may be formed of silicon rubber such as polydimethylsiloxane (PDMS) or elastomers such as polyurethane (PU) and polytetrafluoroethylene (PTFE).

Non-Active Area Driving Element

The gate drivers GD are components which supply a gate voltage to the plurality of pixels PX disposed in the active area AA. The gate drivers GD include a plurality of stages formed on the plurality of outer plate patterns 123 and respective stages of the gate drivers GD may be electrically connected to each other through a plurality of gate connection lines. Accordingly, a gate voltage output from any one of stages may be transmitted to another stage. Further, the respective stages may sequentially supply the gate voltage to the plurality of pixels PX connected to the respective stages.

The power supplies PS may be connected to the gate drivers GD and supply a gate driving voltage and a gate clock voltage. Further, the power supplies PS may be connected to the plurality of pixels PX and supply a pixel driving voltage to each of the plurality of pixels PX. The power supplies PS may also be formed on the plurality of outer plate patterns 123. That is, the power supplies PS may be formed on the plurality of outer plate patterns 123 to be adjacent to the gate drivers GD. Further, each of the power supplies PS formed on the plurality of outer plate patterns 123 may be electrically connected to the gate driver GD and the plurality of pixels PX. That is, the plurality of power supplies PS formed on the plurality of outer plate patterns 123 may be connected by a gate power supply connection line and a pixel power supply connection line. Therefore, each of the plurality of power supplies PS may supply a gate driving voltage, a gate clock voltage, and a pixel driving voltage.

The printed circuit board PCB is a component which transmits signals and voltages for driving the display element from a control unit (or control circuit) to the display element. Therefore, the printed circuit board PCB may also be referred to as a driving substrate. A control unit such as an IC chip or a circuit may be mounted on the printed circuit board PCB. Further, a memory, a processor or the like may be mounted on the printed circuit board PCB. Further, the printed circuit board PCB provided in the display device 100 may include a stretchable area and a non-stretchable area to secure stretchability. Also, on the non-stretchable area, an IC chip, a circuit, a memory, a processor and the like may be mounted, and in the stretchable area, lines electrically connected to the IC chip, the circuit, the memory and the processor may be disposed.

The data driver DD is a component which supplies a data voltage to the plurality of pixels PX disposed in the active area AA. The data driver DD may be configured in a form of an IC chip and thus, may also be referred to as a data integrated circuit D-IC. Further, the data driver DD may be mounted on the non-stretchable area of the printed circuit board PCB. That is, the data driver DD may be mounted on the printed circuit board PCB in a form of a chip on board (COB). Although in FIG. 1, it is illustrated that the data driver DD is mounted in a chip on board (COB) manner, the present disclosure is not limited thereto and the data driver DD may be mounted in a chip on film (COF), a chip on glass (COG), a tape carrier package (TCP) manner, or the like.

Also, although it is illustrated in FIG. 1 that one data driver DD is disposed to correspond to a line of the inner plate patterns 121 disposed in the active area AA, the present disclosure is not limited thereto. That is, one data driver DD may be disposed to correspond to a plurality of columns of the inner plate patterns 121.

Figure 4:
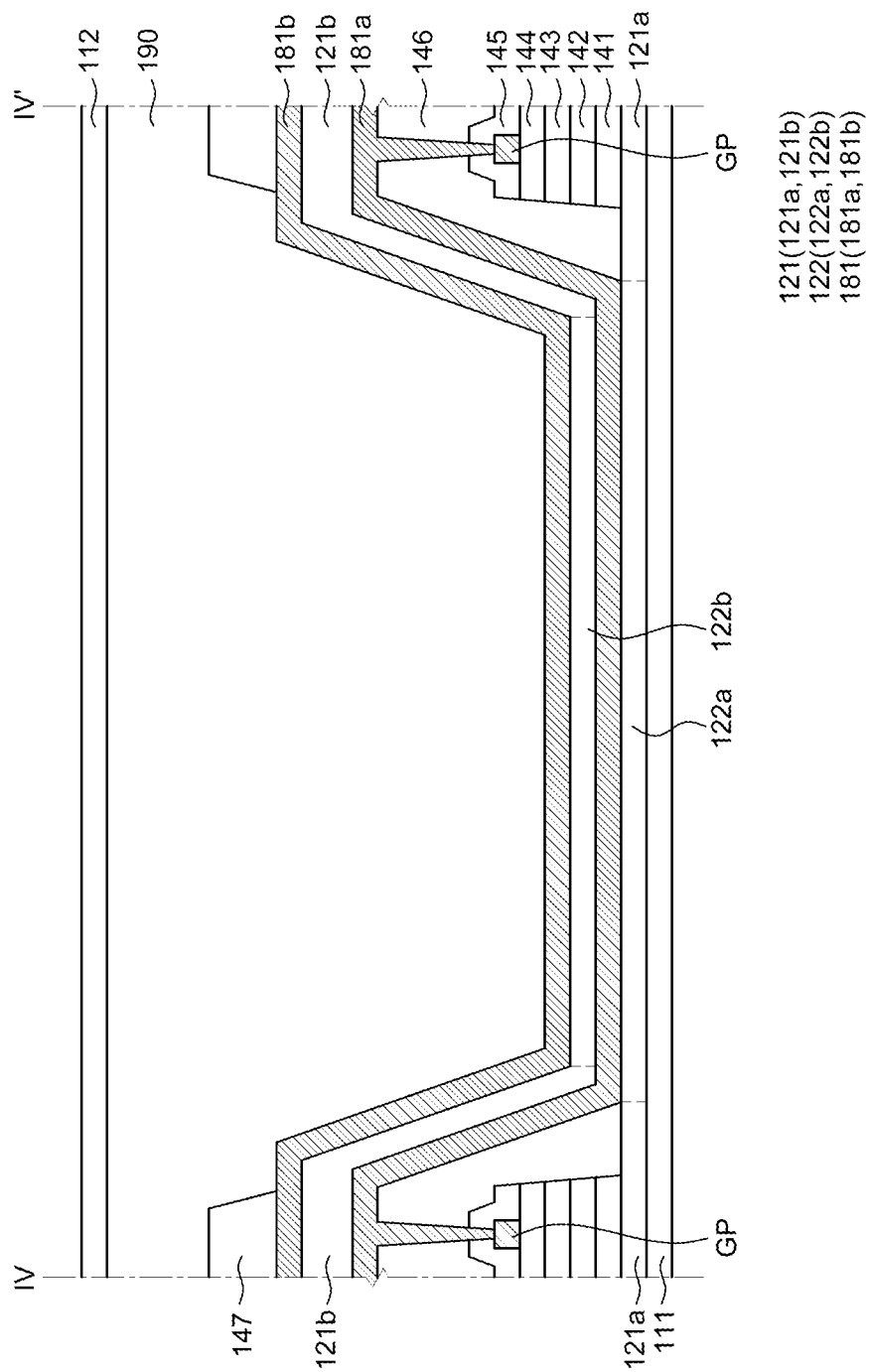
FIG. 4 is a cross-sectional view taken along cutting line IV-IV' shown in FIG. 2.
Figure 5:
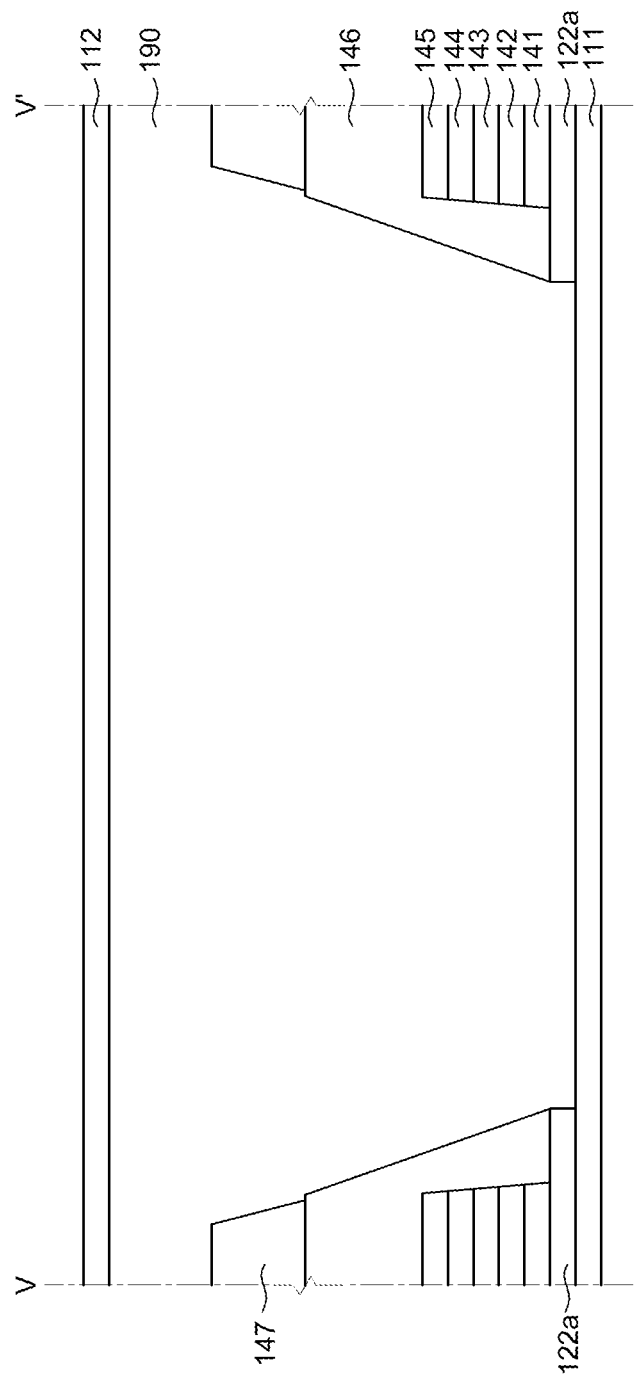
FIG. 5 is a cross-sectional view taken along cutting line V-V' shown in FIG. 2.

Hereinafter, FIGS. 4 and 5 are referred together for a more detailed description of the active area AA of the display device 100 according to an example embodiment of the present disclosure. In addition, for convenience of explanation, the plurality of inner plate patterns 121 are called a plurality of plate patterns 121, and the plurality of inner line patterns 122 are called a plurality of line patterns 122.

Planar and Cross-Sectional Structures of Active Area

FIG. 4 is a cross-sectional view taken along cutting line IV-IV' shown in FIG. 2.

FIG. 5 is a cross-sectional view taken along cutting line V-V' shown in FIG. 2.

FIGS. 1 to 3 are referred together for convenience of explanation.

Referring to FIGS. 3 and 4, the plurality of plate patterns 121 include a lower plate pattern 121a disposed on the lower substrate 111 and an upper plate pattern 121b disposed on the lower plate pattern 121a. In addition, the plurality of line patterns 122 include a lower line pattern 122a disposed on the lower substrate 111 and an upper line pattern 122b disposed on the lower line pattern 122a. That is, the pattern layer 120 may include lower pattern layers 121a and 122a that are disposed on the lower substrate 111 and include a plurality of lower plate patterns 121a and a plurality of lower line patterns 122a, and upper pattern layers 121b and 122b that are disposed on the lower pattern layers 121a and 122a and include a plurality of upper plate patterns 121b and a plurality of upper line patterns 122b.

Referring to FIG. 2 and FIG. 3, the pixels PX including a plurality of sub-pixels SPX are disposed on the plurality of plate patterns 121. Also, each of the sub pixels SPX may include a light emitting element 170 and a pixel circuit including a driving transistor 160 and a switching transistor 150 for driving the light emitting element 170. However, the light emitting element in the sub-pixel SPX is not limited to an LED and may be an organic light emitting diode. Further, the plurality of sub-pixels SPX may include a red sub-pixel, a green sub-pixel, and a blue sub-pixel, but are not limited thereto. Colors of the plurality of sub-pixels SPX may be variously changed as needed.

More specifically, as shown in FIG. 3, the driving transistor 160 and the switching transistor 150 constituting the pixel circuit are disposed on the plurality of lower plate patterns 121a. In addition, the light emitting element 170 is disposed on the plurality of upper plate patterns 121b.

The plurality of sub-pixels SPX may be connected to a plurality of stretched lines 181 and 182. That is, the plurality of sub-pixels SPX may be electrically connected to the first stretched lines 181 extended in the first direction X. Also, the plurality of sub-pixels SPX may be electrically connected to the second stretched lines 182 extended in a second direction Y.

More specifically, as shown in FIG. 4, the first stretched line 181 may include a first lower stretched line 181a disposed on the lower line pattern 122a and a first upper stretched line 181b disposed on the upper line pattern 122b. And, as shown in FIG. 3, the second stretched line 182 may include a second lower stretched line 182a disposed on the lower line pattern 122a and a second upper stretched line 182b disposed on the upper line pattern 122b.

Hereinafter, a cross-sectional structure of the active area AA will be described in detail with reference to FIG. 3.

Referring to FIG. 3, a plurality of inorganic insulating layers are disposed on the plurality of lower plate patterns 121a. For example, the plurality of inorganic insulating layers may include a buffer layer 141, a gate insulating layer 142, a first interlayer insulating layer 143, a second interlayer insulating layer 144, and a passivation layer 145. However, the present disclosure is not limited thereto. Various inorganic insulating layers may be further disposed on the plurality of lower plate patterns 121a. One or more of the buffer layer 141, the gate insulating layer 142, the first interlayer insulating layer 143, the second interlayer insulating layer 144, and the passivation layer 145 which are inorganic insulating layers may be omitted on the plurality of lower plate patterns 121a.

Specifically, the buffer layer 141 is disposed on the plurality of lower plate patterns 121a. The buffer layer 141 is formed on the plurality of lower plate patterns 121a to protect various components of the display device 100 against permeation of moisture ($H_2O$), oxygen ($O_2$) or the like from the outside of the lower substrate 111 and the plurality of lower plate patterns 121a. The buffer layer 141 may be formed of an insulating material. For example, the buffer layer 141 may be formed as a single layer or multiple layers of silicon nitride (SiNx), silicon oxide (SiOx), silicon oxynitride (SiON), or the like. However, the buffer layer 141 may be omitted depending on a structure or characteristics of the display device 100.

In this case, the buffer layer 141 may be formed only in an area where the buffer layer 141 overlaps the plurality of lower plate patterns 121a and the plurality of outer plate patterns 123. As described above, the buffer layer 141 may be formed of an inorganic material. Thus, the buffer layer 141 may be easily damaged, such as easily cracked, while the display device 100 is stretched. Therefore, the buffer layer 141 may not be formed in areas between the plurality of lower plate patterns 121a and the plurality of outer plate patterns 123. The buffer layer 141 may be patterned into shapes of the plurality of lower plate patterns 121a and the plurality of outer plate patterns 123 and formed only on upper portions of the plurality of lower plate patterns 121a and the plurality of outer plate patterns 123. Accordingly, in the display device 100 according to an example embodiment of the present disclosure, the buffer layer 141 is formed only in the area where the buffer layer 141 overlaps the plurality of lower plate patterns 121a and the plurality of outer plate patterns 123 which are rigid substrates, so that damage to various components of the display device 100 may be prevented even when the display device 100 is deformed, such as bent or stretched.

Referring to FIG. 3, the switching transistor 150 including a gate electrode 151, an active layer 152, a source electrode 153 and a drain electrode 154, and the driving transistor 160 including a gate electrode 161, an active layer 162, a source electrode and a drain electrode 164 are formed on the buffer layer 141.

First, referring to FIG. 1, the active layer 152 of the switching transistor 150 and the active layer 162 of the driving transistor 160 are disposed on the buffer layer 141. For example, each of the active layer 152 of the switching transistor 150 and the active layer 162 of the driving transistor 160 may be formed of an oxide semiconductor. Alternatively, the active layer 152 of the switching transistor 150 and the active layer 162 of the driving transistor 160 may be formed of amorphous silicon (a-Si), polycrystalline silicon (poly-Si), an organic semiconductor or the like.

The gate insulating layer 142 is disposed on the active layer 152 of the switching transistor 150 and the active layer 162 of the driving transistor 160. The gate insulating layer 142 is configured to electrically insulate the gate electrode 151 of the switching transistor 150 from the active layer 152 of the switching transistor 150 and electrically insulate the gate electrode 161 of the driving transistor 160 from the active layer 162 of the driving transistor 160. Further, the gate insulating layer 142 may be formed of an insulating material. For example, the gate insulating layer 142 may be formed as a single layer of silicon nitride (SiNx) or silicon oxide (SiOx) or multiple layers of silicon nitride (SiNx) or silicon oxide (SiOx), but is not limited thereto.

The gate electrode 151 of the switching transistor 150 and the gate electrode 161 of the driving transistor 160 are disposed on the gate insulating layer 142. The gate electrode 151 of the switching transistor 150 and the gate electrode 161 of the driving transistor 160 are disposed to be spaced apart from each other on the gate insulating layer 142. Further, the gate electrode 151 of the switching transistor 150 overlaps the active layer 152 of the switching transistor 150, and the gate electrode 161 of the driving transistor 160 overlaps the active layer 162 of the driving transistor 160.

Each of the gate electrode 151 of the switching transistor 150 and the gate electrode 161 of the driving transistor 160 may be formed of any one of various metal materials, for example, any one of molybdenum (Mo), aluminum (Al), chromium (Cr), gold (Au), titanium (Ti), nickel (Ni), neodymium (Nd) and copper (Cu). Alternatively, each of the gate electrode 151 of the switching transistor 150 and the gate electrode 161 of the driving transistor 160 may be formed of an alloy of two or more of them, or a plurality of layer thereof, but is not limited thereto.

The first interlayer insulating layer 143 is disposed on the gate electrode 151 of the switching transistor 150 and the gate electrode 161 of the driving transistor 160. The first interlayer insulating layer 143 insulates the gate electrode 161 of the driving transistor 160 from an intermediate metal layer IM. The first interlayer insulating layer 143 may also be formed of an inorganic material like the buffer layer 141. For example, the first interlayer insulating layer 143 may be formed as a single layer of silicon nitride (SiNx) or silicon oxide (SiOx) or multiple layers of silicon nitride (SiNx) or silicon oxide (SiOx), but is not limited thereto.

The intermediate metal layer IM is disposed on the first interlayer insulating layer 143. Further, the intermediate metal layer IM overlaps the gate electrode 161 of the driving transistor 160. Thus, a storage capacitor is formed in an area where the intermediate metal layer IM overlaps the gate electrode 161 of the driving transistor 160. Specifically, the gate electrode 161 of the driving transistor 160, the first interlayer insulating layer 143 and the intermediate metal layer IM form the storage capacitor. However, a position of the intermediate metal layer IM is not limited thereto. The intermediate metal layer IM may overlap another electrode to form a storage capacitor in various ways.

The intermediate metal layer IM may be formed of any one of various metal materials, for example, any one of molybdenum (Mo), aluminum (Al), chromium (Cr), gold (Au), titanium (Ti), nickel (Ni), neodymium (Nd) and copper (Cu). Alternatively, the intermediate metal layer IM may be formed of an alloy of two or more of them, or a plurality of layer thereof, but is not limited thereto.

The second interlayer insulating layer 144 is disposed on the intermediate metal layer IM. The second interlayer insulating layer 144 insulates the gate electrode 151 of the switching transistor 150 from the source electrode 153 and the drain electrode 154 of the switching transistor 150. Also, the second interlayer insulating layer 144 insulates the intermediate metal layer IM from the source electrode and the drain electrode 164 of the driving transistor 160. The second interlayer insulating layer 144 may also be formed of an inorganic material like the buffer layer 141. For example, the first interlayer insulating layer 143 may be formed as a single layer of silicon nitride (SiNx) or silicon oxide (SiOx) or multiple layers of silicon nitride (SiNx) or silicon oxide (SiOx), but is not limited thereto.

The source electrode 153 and the drain electrode 154 of the switching transistor 150 are disposed on the second interlayer insulating layer 144. Also, the source electrode and the drain electrode 164 of the driving transistor 160 are disposed on the second interlayer insulating layer 144. The source electrode 153 and the drain electrode 154 of the switching transistor 150 are disposed to be spaced apart from each other on the same layer. Further, although FIG. 1 does not illustrate the source electrode of the driving transistor 160, the source electrode of the driving transistor 160 is also disposed to be spaced apart from the drain electrode 164 of the driving transistor 160 on the same layer. In the switching transistor 150, the source electrode 153 and the drain electrode 154 may be electrically connected to the active layer 152 to be in contact with the active layer 152. Also, in the driving transistor 160, the source electrode and the drain electrode 164 may be electrically connected to the active layer 162 to be in contact with the active layer 162. Further, the drain electrode 154 of the switching transistor 150 may be electrically connected to the gate electrode 161 of the driving transistor 160 to be in contact with the gate electrode 161 of the driving transistor 160 through a contact hole.

The source electrode 153 and the drain electrodes 154 and 164 may be formed of any one of various metal materials, for example, any one of molybdenum (Mo), aluminum (Al), chromium (Cr), gold (Au), titanium (Ti), nickel (Ni), neodymium (Nd) and copper (Cu). Alternatively, the source electrode 153 and the drain electrodes 154 and 164 may be formed of an alloy of two or more of them, or a plurality of layer thereof, but are not limited thereto.

Further, in the present disclosure, the driving transistor 160 has been described as having a coplanar structure, but various types of transistors having a staggered structure or the like may also be used. Also, in the present specification, the transistor may be formed not only in a top gate structure but also in a bottom gate structure.

A gate pad GP and a data pad DP may be disposed on the second interlayer insulating layer 144.

Specifically, referring to FIG. 4, the gate pad GP serves to transfer a gate voltage to the plurality of sub-pixels SPX. The gate pad GP is connected to the first lower stretched line 181a through a contact hole. In addition, the gate voltage supplied from the first lower stretched line 181a may be transferred from the gate pad GP to the gate electrode 151 of the switching transistor 150 through a line formed on the lower plate pattern 121a.

In addition, referring to FIG. 3, the data pad DP serves to transfer a data voltage to the plurality of sub-pixels SPX. The data pad DP is connected to the second lower stretched line 182a through a contact hole. In addition, the data voltage supplied from the second lower stretched line 182a may be transferred from the data pad DP to the source electrode 153 of the switching transistor 150 through an unstretched line formed on the lower plate pattern 121a.

Although not shown in FIG. 3, the display device according to an example embodiment of the present disclosure may further include a voltage pad that is connected to the upper stretched lines through a contact hole. The above-described voltage pad is a pad for transferring a low potential voltage or a high potential voltage to the plurality of sub-pixels SPX. In addition, the low potential voltage supplied from the voltage pad may be transferred to an n-electrode 174 of the light emitting element 170 through a second connection pad CNT2. In addition, the high potential voltage supplied from the voltage pad may be transmitted to the source electrode 163 of the driving transistor 160.

A voltage pad VP, the gate pad GP, and the data pad DP may be formed of the same material as the source electrode 153 and the drain electrodes 154 and 164, but are not limited thereto.

Referring to FIG. 3, the passivation layer 145 is formed on the switching transistor 150 and the driving transistor 160. The passivation layer 145 covers the switching transistor 150 and the driving transistor 160 to protect the switching transistor 150 and the driving transistor 160 against permeation of moisture, oxygen, and the like. The passivation layer 145 may be formed of an inorganic material and formed as a single layer or a plurality of layers, but is not limited thereto.

Also, the gate insulating layer 142, the first interlayer insulating layer 143, the second interlayer insulating layer 144 and the passivation layer 145 may be patterned and formed only in an area where they overlap the plurality of lower plate patterns 121a. The gate insulating layer 142, the first interlayer insulating layer 143, the second interlayer insulating layer 144 and the passivation layer 145 may also be formed of an inorganic material like the buffer layer 141. Thus, the gate insulating layer 142, the first interlayer insulating layer 143, the second interlayer insulating layer 144 and the passivation layer 145 may be easily damaged, such as easily cracked, while the display device 100 is stretched. Therefore, the gate insulating layer 142, the first interlayer insulating layer 143, the second interlayer insulating layer 144 and the passivation layer 145 may not be formed in areas between the plurality of lower plate patterns 121a and may be patterned into the shapes of the plurality of lower plate patterns 121a and formed only on upper portions of the plurality of lower plate patterns 121a.

A planarization layer 146 is formed on the passivation layer 145. The planarization layer 146 serves to flatten upper portions of the switching transistor 150 and the driving transistor 160. The planarization layer 146 may be formed as a single layer or a plurality of layers and may be formed of an organic material. Thus, the planarization layer 146 may also be referred to as an organic insulating layer. For example, the planarization layer 146 may be formed of an acrylic-based organic material, but is not limited thereto.

Referring to FIG. 3, the planarization layer 146 may be disposed on the plurality of lower plate patterns 121a to cover upper surfaces and side surfaces of the buffer layer 141, the gate insulating layer 142, the first interlayer insulating layer 143, the second interlayer insulating layer 144 and the passivation layer 145. In addition, the planarization layer 146 surrounds the buffer layer 141, the gate insulating layer 142, the first interlayer insulating layer 143, the second interlayer insulating layer 144 and the passivation layer 145 together with the plurality of lower plate patterns 121a. Specifically, the planarization layer 146 may be disposed to cover an upper surface and a side surface of the passivation layer 145, a side surface of the first interlayer insulating layer 143, a side surface of the second interlayer insulating layer 144, a side surface of the gate insulating layer 142, a side surface of the buffer layer 141 and a part of upper surfaces of the plurality of lower plate patterns 121a. Thus, the planarization layer 146 may compensate for steps between the side surfaces of the buffer layer 141, the gate insulating layer 142, the first interlayer insulating layer 143, the second interlayer insulating layer 144 and the passivation layer 145, and the planarization layer 146 may enhance adhesion strength between the planarization layer 146 and the second lower stretched line 182a disposed on a side surface of the planarization layer 146.

Referring to FIG. 3, an incline angle of the side surface of the planarization layer 146 may be less than those of the side surfaces of the buffer layer 141, the gate insulating layer 142, the first interlayer insulating layer 143, the second interlayer insulating layer 144 and the passivation layer 145. For example, the side surface of the planarization layer 146 may have a gentle incline than the side surface of the passivation layer 145, the side surface of the first interlayer insulating layer 143, the side surface of the second interlayer insulating layer 144, the side surface of the gate insulating layer 142 and the side surface of the buffer layer 141. Thus, the stretched lines 181 and 182 that are disposed to be in contact with the side surfaces of the planarization layer 146 are disposed to have a gentle incline. Therefore, when the display device 100 is stretched, a stress generated in the second lower stretched line 182a may be reduced. Also, it is possible to suppress cracks in the second lower stretched line 182a or peeling of the second lower stretched line 182a from the side surface of the planarization layer 146.

Referring to FIGS. 2 to 4, the stretched lines 181 and 182 refer to lines that electrically connect the plurality of pixels on the plurality of lower plate patterns 121a. The stretched lines 181 and 182 are disposed on the plurality of line patterns 122.

More specifically, the first lower stretched line 181a and the second lower stretched line 182a may be disposed on the lower line pattern 122a, and the first upper stretched line 181*b* and the second upper stretched line 182*b* may be disposed on the upper line pattern 122*b*.

In addition, the stretched lines 181 and 182 may also extend on the plurality of line patterns 122 to be electrically connected to the gate pad GP and the data pad DP on the plurality of lower plate patterns 121*a*. Also, referring to FIG. 2, the line pattern 122 is not disposed in an area between the plurality of lower plate patterns 121*a*, in which the stretched lines 181 and 182 are not disposed.

The stretched lines 181 and 182 include the first stretched lines 181 and the second stretched lines 182. The first stretched lines 181 and the second stretched lines 182 are disposed between the plurality of lower plate patterns 121*a*. Specifically, the first stretched lines 181 refer to lines extended in an X-axis direction between the plurality of lower plate patterns 121*a* among the stretched lines 181 and 182. The second stretched lines 182 refer to lines extended in a Y-axis direction between the plurality of lower plate patterns 121*a* among the stretched lines 181 and 182.

More specifically, as shown in FIG. 4, the first stretched line 181 may include the first lower stretched line 181*a* disposed on the lower line pattern 122*a* and the first upper stretched line 181*b* disposed on the upper line pattern 122*b*. And, as shown in FIG. 3, the second stretched line 182 may include the second lower stretched line 182*a* disposed on the lower line pattern 122*a* and the second upper stretched line 182*b* disposed on the upper line pattern 122*b*.

The stretched lines 181 and 182 may be formed of a metal material such as copper (Cu), aluminum (Al), titanium (Ti) or molybdenum (Mo), or the stretched lines 181 and 182 may have a laminated structure of metal materials such as copper/molybdenum-titanium (Cu/MoTi), titanium/aluminum/titanium (Ti/Al/Ti), or the like, but are not limited thereto.

In a display panel of a general display device, various lines such as a plurality of gate lines and a plurality of data lines are extended in straight lines and are disposed between a plurality of sub-pixels, and the plurality of sub-pixels are connected to a single signal line. Therefore, in the display panel of the general display device, various lines such as a gate line, a data line, a high potential voltage line, a reference line and the like are continuously extended on a substrate from one side to the other side of the display panel of an organic light emitting display device.

Unlike this, in the display device 100 according to an example embodiment of the present disclosure, various lines such as a gate line, a data line, a high potential voltage line, a reference line, an initialization voltage line and the like which are unstretched lines formed in straight lines and considered to be used in a display panel of a general display device, are disposed only on the plurality of lower plate patterns 121*a* and the plurality of outer plate patterns 123. In the display device 100 according to an example embodiment of the present disclosure, unstretched lines formed in straight lines are disposed only on the plurality of lower plate patterns 121*a* and the plurality of outer plate patterns 123.

In the display device 100 according to an example embodiment of the present disclosure, the pads on two adjacent lower plate patterns 121*a* may be connected by the stretched lines 181 and 182. Accordingly, the stretched lines 181 and 182 electrically connect various pads such as the gate pads GP or the data pads DP on the two adjacent lower plate patterns 121*a*. Therefore, the display device 100 according to an example embodiment of the present disclosure may include the plurality of stretched lines 181 and 182 to electrically connect various unstretched lines, such as a gate line, a data line, a high potential voltage line, a reference line, and the like between the plurality of lower plate patterns 121*a*. For example, gate lines which are unstretched lines may be disposed on the plurality of lower plate patterns 121*a* disposed adjacent to each other in the first direction X. Also, the gate pads GP may be disposed on both ends of the gate lines. In this case, a plurality of the gate pads GP on the plurality of lower plate patterns 121*a* disposed adjacent to each other in the first direction X may be connected to each other by the first lower stretched line 181*a* serving as the gate line. Therefore, the gate lines disposed on the plurality of lower plate patterns 121*a* and the first lower stretched lines 181*a* disposed on the inner line patterns 122 may serve as single gate lines. The gate lines described above may be referred to as scan signal lines. Further, lines, such as an emission signal line, a low potential voltage line and a high potential voltage line which are extended in the first direction X among all of various lines that may be included in the display device 100, may also be electrically connected by the first stretched lines 181 as described above.

Referring to FIG. 2 and FIG. 4, the first stretched lines 181 may connect unstretched lines or the gate pads GP on two lower plate patterns 121*a* that are disposed side by side among the gate pads GP on the plurality of lower plate patterns 121*a* disposed adjacent to each other in the first direction X. Alternatively, the first stretched line 181 may serve as a gate line, an emission signal line, a high potential voltage line, or a low potential voltage line, but is not limited thereto. The gate pads GP on the plurality of lower plate patterns 121*a* disposed in the first direction X may be connected by the first lower stretched lines 181*a* serving as the gate lines. A single gate voltage may be transferred thereto.

Further, referring to FIG. 2 and FIG. 3, the second stretched lines 182 may connect unstretched lines or the data pads DP on two lower plate patterns 121*a* that are disposed side by side among the data pads DP on the plurality of lower plate patterns 121*a* disposed adjacent to each other in the second direction Y. The second stretched line 182 may serve as a data line, a high potential voltage line, a low potential voltage line or a reference line, but is not limited thereto. Lines on the plurality of lower plate patterns 121*a* disposed in the second direction Y may be connected by a plurality of the second low stretched lines 182*a* serving as the data lines. A single data voltage may be transferred thereto.

As shown in FIG. 4, the first lower stretched line 181*a* may be in contact with an upper surface and the side surface of the planarization layer 146 disposed on the lower plate pattern 121*a*. In addition, the first lower stretched line 181*a* may be extended to an upper surface of the lower line pattern 122*a*. In addition, the first upper stretched line 181*b* may be formed on the upper plate pattern 121*b* disposed on the first lower stretched line 181*a*. The second low stretched line 182*a* may be disposed to be in contact with the upper surface and the side surface of the planarization layer 146 disposed on the lower plate pattern 121*a*. In addition, the second lower stretched line 182*a* may be extended to the upper surface of the lower line pattern 122*a*. In addition, the second upper stretched line 182*b* may be formed on the upper plate pattern 121*b* disposed on the second lower stretched line 182*a*.

However, as shown in FIG. 5, there is no need for a rigid pattern to be disposed in an area where the first stretched line 181 and the second stretched line 182 are not disposed.

Thus, the inner line pattern 122, which is a rigid pattern, is not disposed under the first stretched line 181 and the second stretched line 182.

Meanwhile, referring to FIG. 3, the upper pattern layers 121b and 122b are formed on the lower stretched lines 181a and 182a and the planarization layer 146. The upper pattern layers 121b and 122b may be disposed on the lower pattern layers 121a and 122a. In addition, the upper pattern layers 121b and 122b may include the plurality of upper plate patterns 121b and the plurality of upper line patterns 122b.

The upper pattern layers 121b and 122b are an insulating material and may be formed of a plastic material having low flexibility, for example, may be formed of polyimide (PI), polyacrylate, polyacetate or the like.

Accordingly, the upper pattern layers 121b and 122b serve to insulate adjacent components. Specifically, the plurality of upper plate patterns 121b electrically insulate the light emitting element LED from the lower stretched lines 181a and 182a, and the plurality of upper line patterns 122b electrically insulate the upper stretched lines 181b and 182b and the lower stretched lines 181a and 182a. Accordingly, the upper stretched lines 181b and 182b and the lower stretched lines 181a and 182a may transmit different voltages or different signals.

In addition, the upper stretched lines 181b and 182b, a bank 147 and the light emitting element 170 may be disposed on the upper pattern layers 121b and 122b.

Specifically, referring to FIG. 3, the bank 147 is formed on a first connection pad CNT1, the upper stretched lines 181b and 182b, and the planarization layer 146. The bank 147 is a component to distinguish adjacent sub-pixels SPX. The bank 147 is disposed to cover at least a part of the pad PD, the upper stretched lines 181b and 182b, and the planarization layer 146. The bank 147 may be formed of an insulating material. Further, the bank 147 may contain a black material. Since the bank 147 contains a black material, the bank 147 serves to hide lines which are visible through the active area AA. The bank 147 may be formed of, for example, a transparent carbon-based mixture. Specifically, the bank 147 may contain carbon black, but is not limited thereto. The bank 147 may also be formed of a transparent insulating material. Also, although a height of the bank 147 is shown to be lower than a height of the light emitting element 170 in FIG. 3, the height of the bank 147 is not limited thereto, and the height of the bank 147 may be the same as the height of the light emitting element 170.

Referring to FIG. 3, the light emitting element 170 is disposed on the first connection pad CNT1 and the second connection pad CNT2. The light emitting element 170 includes an n-type layer 171, an active layer 172, a p-type layer 173, an n-electrode 174 and a p-electrode 175. The light emitting element 170 of the display device 100 according to an example embodiment of the present disclosure has a flip-chip structure in which the n-electrode 174 and the p-electrode 175 are formed on one surface thereof.

The n-type layer 171 may be formed by injecting n-type impurities into gallium nitride (GaN) having excellent crystallinity. The n-type layer 171 may be disposed on a separate base substrate which is formed of a light emitting material.

The active layer 172 is disposed on the n-type layer 171. The active layer 172 is a light emitting layer that emits light in the light emitting element 170 and may be formed of a nitride semiconductor, for example, indium gallium nitride (InGaN). The p-type layer 173 is disposed on the active layer 172. The p-type layer 173 may be formed by injecting p-type impurities into gallium nitride (GaN).

As described above, the light emitting element 170 according to an example embodiment of the present disclosure is manufactured by sequentially laminating the n-type layer 171, the active layer 172, and the p-type layer 173, and then, etching a predetermined area of the layers to thereby form the n-electrode 174 and the p-electrode 175. In this case, the predetermined area is a space to separate the n-electrode 174 and the p-electrode 175 from each other and is etched to expose a part of the n-type layer 171. In other words, a surface of the light emitting element 170 on which the n-electrode 174 and the p-electrode 175 are to be disposed may not be flat and may have different levels of height.

In this manner, the n-electrode 174 is disposed in the etched area, and the n-electrode 174 may be formed of a conductive material. In addition, the p-electrode 175 is disposed in a non-etched area, and the p-electrode 175 may also be formed of a conductive material. For example, the n-electrode 174 is disposed on the n-type layer 171 exposed by an etching process, and the p-electrode 175 is disposed on the p-type layer 173. The p-electrode 175 may be formed of the same material as the n-electrode 174.

An adhesive layer AD is disposed on upper surfaces of the first connection pad CNT1 and the second connection pad CNT2 and between the first connection pad CNT1 and the second connection pad CNT2. Thus, the light emitting element 170 may be bonded onto the first connection pad CNT1 and the second connection pad CNT2. In this case, the n-electrode 174 may be disposed on the second connection pad CNT2 and the p-electrode 175 may be disposed on the first connection pad CNT1.

The adhesive layer AD may be a conductive adhesive layer formed by dispersing conductive balls in an insulating base member. Thus, when heat or pressure is applied to the adhesive layer AD, the conductive balls are electrically connected to have conductive properties in a portion of the adhesive layer AD to which heat or pressure is applied. Also, an area of the adhesive layer AD to which pressure is not applied may have insulating properties. For example, the n-electrode 174 is electrically connected to the second connection pad CNT2 through the adhesive layer AD, and the p-electrode 175 is electrically connected to the first connection pad CNT1 through the adhesive layer AD. After applying the adhesive layer AD to an upper surface of the second connection pad CNT2 and the first connection pad CNT1 by an inkjet method or the like, the light emitting element 170 may be transferred onto the adhesive layer AD. Then, the light emitting element 170 may be pressed and heated to thereby electrically connect the first connection pad CNT1 to the p-electrode 175 and the second connection pad CNT2 to the n-electrode 174. However, other portions of the adhesive layer AD excluding a portion of the adhesive layer AD disposed between the n-electrode 174 and the second connection pad CNT2 and a portion of the adhesive layer AD disposed between the p-electrode 175 and the first connection pad CNT1 have insulating properties. Meanwhile, the adhesive layer AD may be separately disposed on each of the first connection pad CNT1 and the second connection pad CNT2.

Further, the first connection pad CNT1 is electrically connected to the drain electrode 164 of the driving transistor 160 and receives a driving voltage for driving the light emitting element 170 from the driving transistor 160. Although FIG. 3 illustrates that the first connection pad CNT1 and the drain electrode 164 of the driving transistor 160 are indirectly connected to each other without directly contacting them, the present disclosure is not limited thereto, and the first connection pad CNT1 and the drain electrode 164 of the driving transistor 160 may be in direct contact. In addition, a low potential driving voltage for driving the light emitting element 170 is applied to the second connection pad CNT2. Accordingly, when the display device 100 is turned on, different voltage levels that are applied to the first connection pad CNT1 and the second connection pad CNT2 are respectively transferred to the n-electrode 174 and the p-electrode 175, so that the light emitting element 170 emits light.

The upper substrate 112 serves to support various components disposed under the upper substrate 112. Specifically, the upper substrate 112 may be formed by coating and hardening a material for forming the upper substrate 112 on the lower substrate 111 and the lower plate patterns 121a. Thus, the upper substrate 112 may be disposed to be in contact with the lower substrate 111, the lower plate patterns 121a, the lower line pattern 122a and the stretched lines 181 and 182.

The upper substrate 112 may be formed of the same material as the lower substrate 111. For example, the upper substrate 112 may be formed of silicone rubber such as polydimethylsiloxane (PDMS) or elastomers such as polyurethane (PU) and polytetrafluoroethylene (PTFE). Thus, the upper substrate 112 may have flexibility. However, the materials of the upper substrate 112 are not limited thereto.

Meanwhile, although not shown in FIG. 3, a polarizing layer may also be disposed on the upper substrate 112. The polarizing layer polarizes light incident from the outside of the display device and reduces reflection of external light. Further, instead of the polarizing layer, other optical films or the like may be disposed on the upper substrate 112.

In addition, the filling layer 190 that is disposed on an entire surface of the lower substrate 111 and fills a gap between components disposed on the upper substrate 112 and the lower substrate 111 may be disposed. The filling layer 190 may be formed of a curable adhesive. Specifically, a material for forming the filling layer 190 is coated on the entire surface of the lower substrate 111 and then cured, so that the filling layer 190 may be disposed between components disposed on the upper substrate 112 and the lower substrate 111. For example, the filling layer 190 may be an optically clear adhesive (OCA), and may include an acrylic adhesive, a silicone adhesive, and a urethane adhesive.

Sub-Pixel Circuit Diagram

Figure 6:
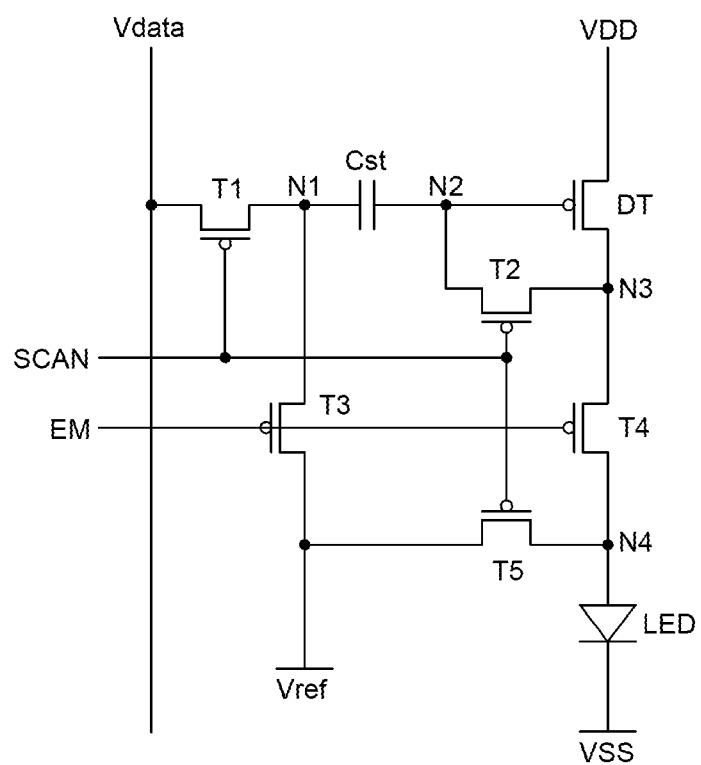
FIG. 6 is a circuit diagram of sub-pixels of the display device according to an example embodiment of the present disclosure.

FIG. 6 is a circuit diagram of a sub-pixel of the display device according to an example embodiment of the present disclosure.

For reference, the switching transistor 150 shown in FIG. 3 may correspond to a first transistor T1 of FIG. 6, the driving transistor 160 shown in FIG. 3 may correspond to a driving transistor DT of FIG. 6, and the light emitting element 170 shown in FIG. 3 may correspond to a light emitting element LED of FIG. 6.

In the display device according to an example embodiment of the present disclosure, each of the sub-pixels includes a light emitting element LED, a driving transistor DT, a first transistor T1 to a fifth transistor T5, and a storage capacitor Cst.

The light emitting element LED emits light by a driving current supplied from the driving transistor DT. An anode electrode of the light emitting element LED is connected to a fourth transistor T4 and the fifth transistor T5, and a cathode electrode of the light emitting element LED is connected to a low potential voltage line to which a low potential voltage VSS is applied.

The driving transistor DT controls a driving current applied to the light emitting element LED according to its gate-source voltage Vgs. In addition, a source electrode of the driving transistor DT is connected to a high potential voltage line to which a high potential voltage VDD is applied, a gate electrode of the driving transistor DT is connected to a second node N2, and a drain electrode of the driving transistor DT is connected to a third node N3.

The first transistor T1 applies a data voltage Vdata supplied from a data line to a first node N1. The first transistor T1 includes a source electrode connected to the data line, a drain electrode connected to the first node N1, and a gate electrode connected to a scan signal line that transmits a scan signal SCAN. Accordingly, the first transistor T1 applies the data voltage Vdata supplied from the data line to the first node N1 in response to the scan signal SCAN at a low level, which is a turn-on level. That is, the first transistor T1 may be a switching transistor that applies any one of a plurality of data voltages Vdata to each of a plurality of pixel circuits according to the scan signal SCAN.

The second transistor T2 diode-connects the gate electrode and the drain electrode of the driving transistor DT. The second transistor T2 includes a source electrode connected to the third node N3 that is the drain electrode of the driving transistor DT, a drain electrode connected to the second node N2 that is the gate electrode of the driving transistor DT, and a gate electrode connected to the scan signal line that transmits the scan signal SCAN. Accordingly, the second transistor T2 diode-connects the gate electrode and the drain electrode of the driving transistor DT in response to the scan signal SCAN at a low level, which is a turn-on level.

A third transistor T3 applies a reference voltage Vref to the first node N1. The third transistor T3 includes a source electrode connected to a reference line that transmits the reference voltage Vref, a drain electrode connected to the first node N1, and a gate electrode connected to an emission signal line that transmits an emission signal EM. Accordingly, the third transistor T3 applies the reference voltage Vref to the first node N1 in response to the emission signal EM at a low level, which is a turn-on level.

The fourth transistor T4 forms a current path between the driving transistor DT and the light emitting element LED. The fourth transistor T4 includes a source electrode connected to the third node N3 that is the drain electrode of the driving transistor DT, a drain electrode connected to the light emitting element LED, and a gate electrode connected to the emission signal line that transmits the emission signal EM. Accordingly, the fourth transistor T4 may be an emission control transistor that forms a current path between the light emitting element LED and the drain electrode of the driving transistor DT in response to the emission signal EM.

The fifth transistor T5 applies the reference voltage Vref to the anode electrode of the light emitting element LED. The fifth transistor T5 includes a source electrode connected to the reference line that transmits the reference voltage Vref, a drain electrode connected to the anode electrode of the light emitting element LED, and a gate electrode connected to the scan signal line that transmits the scan signal SCAN. Accordingly, the fifth transistor T5 applies the reference voltage Vref to the anode electrode of the light emitting element LED in response to the scan signal SCAN at a low level, which is a turn-on level. The fifth transistor T5 may be an initialization transistor that applies the reference voltage Vref to the anode electrode of the light emitting element LED.

The storage capacitor Cst includes a first electrode connected to the first node N1 and a second electrode connected to the second node N2. That is, one electrode of the storage capacitor Cst is connected to the gate electrode of the driving transistor DT, and the other electrode of the storage capacitor Cst is connected to the drain electrode of the first transistor T1.

Arrangement Relationship of Stretched Lines and Unstretched Lines

Figure 7A:
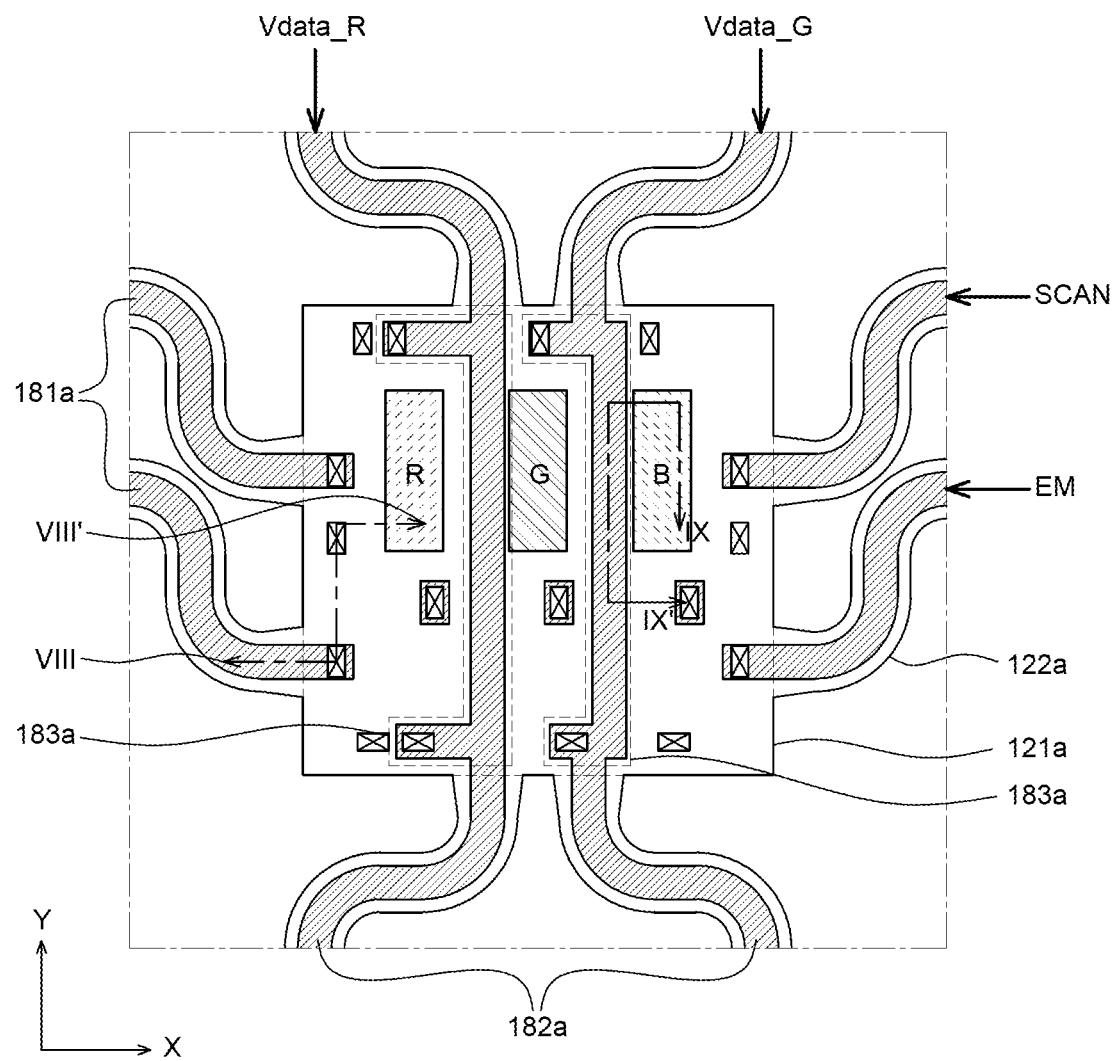
FIG. 7A is a view illustrating an arrangement relationship of a lower stretched line and a lower unstretched line of the display device according to an example embodiment of the present disclosure.

FIG. 7A is a view illustrating an arrangement relationship of a lower stretched line and a lower unstretched line of the display device according to an example embodiment of the present disclosure.

Figure 7B:
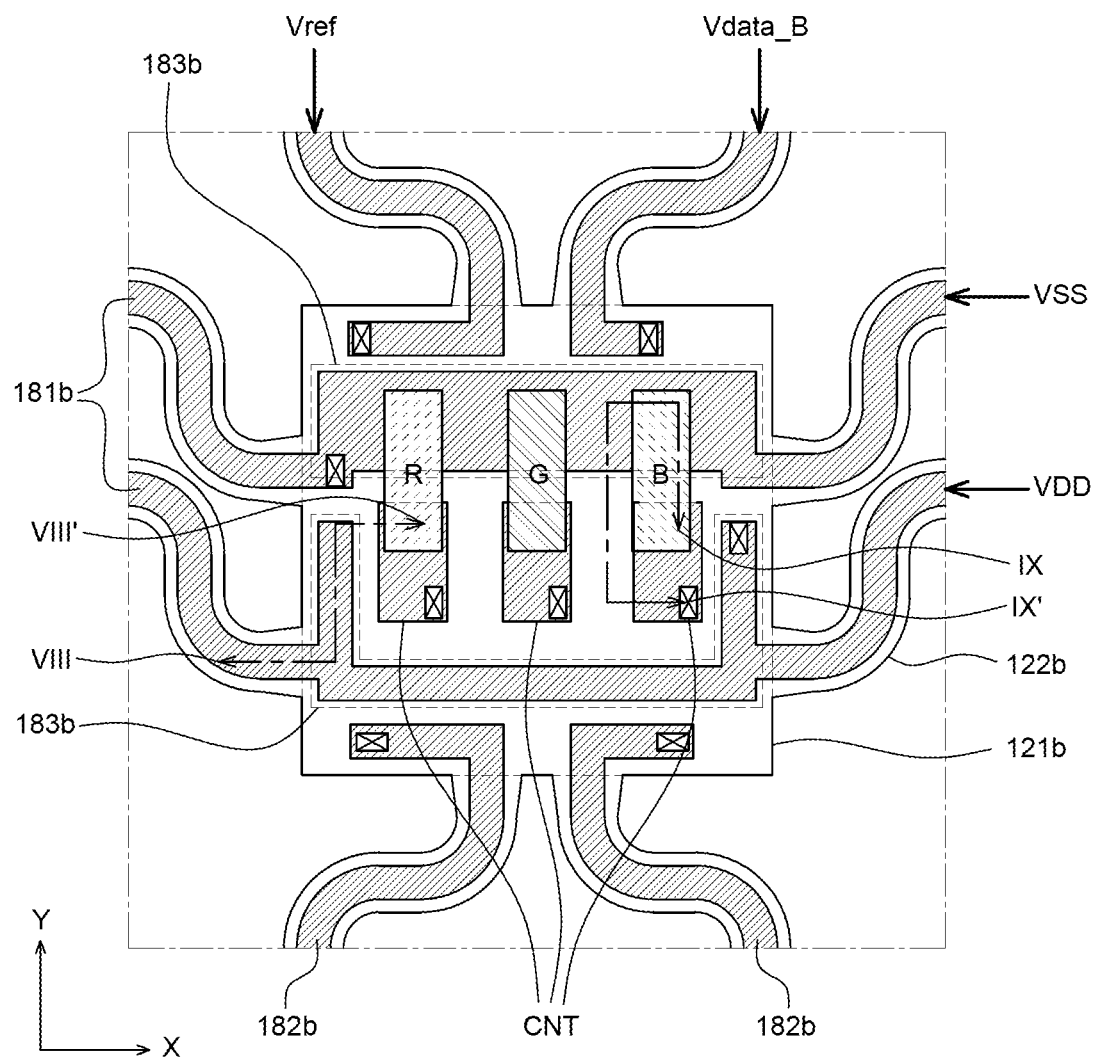
FIG. 7B is a view illustrating an arrangement relationship of an upper stretched line and an upper unstretched line of the display device according to an example embodiment of the present disclosure.

FIG. 7B is a view illustrating an arrangement relationship of an upper stretched line and an upper unstretched line of the display device according to an example embodiment of the present disclosure.

The arrangement relationship of the lower stretched line and the lower unstretched line shown in FIG. 7A and the arrangement relationship of the upper stretched line and the upper unstretched line illustrated in FIG. 7B may overlap in a direction in which they are perpendicular to each other on an X-Y plane.

Hereinafter, for convenience of explanation, the light emitting element 170 will be described as a plurality of light emitting elements R, G, and B. The data voltages Vdata may include a first data voltage Vdata_R which is input to a red light emitting element R, a second data voltage Vdata_G which is input to a green light emitting element G, and a third data voltage Vdata_B which is input to a blue light emitting element B.

Referring to FIG. 7A, a plurality of lower unstretched lines 183a are disposed on the lower plate pattern 121a. In addition, a plurality of first lower stretched lines 181a and a plurality of second lower stretched lines 182a are disposed on the plurality of lower line patterns 122a.

In addition, the plurality of respective lower unstretched lines 183a may extend in the second direction Y and be connected to the plurality of second lower unstretched lines 182a. For example, the plurality of lower unstretched lines 183a and the plurality of second lower stretched lines 182a may be integrally formed. Each of the plurality of second lower stretched lines 182a and each of the plurality of lower unstretched lines 183a may be formed of one conductive layer.

In addition, the scan signal SCAN and the emission signal EM are applied to the plurality of first lower stretched lines 181a. Accordingly, one of the plurality of first lower stretched lines 181a may function as a scan signal line that transmits the scan signal SCAN, and the other one of the plurality of first lower stretched lines 181a may function as an emission signal line that transmits the emission signal EM. That is, the plurality of first lower stretched lines 181a may serve as gate lines.

In addition, each of the plurality of first lower stretched lines 181a may be electrically connected to each other through a metal layer disposed under the plurality of first lower stretched lines 181a in the lower plate pattern 121a.

In addition, the first data voltage Vdata_R and the second data voltage Vdata_G are applied to the plurality of second lower stretched lines 182a. Accordingly, one of the plurality of second lower stretched lines 182a may function as a first data line that transmits the first data voltage Vdata_R, and the other one of the plurality of second lower stretched lines 182a may function as a second data line that transmits the second data voltage Vdata_G. That is, the plurality of second lower stretched lines 182a may serve as a plurality of data lines.

In addition, each of the plurality of second lower stretched lines 182a may be electrically connected to each other through each of the plurality of lower unstretched lines 183a disposed on the lower plate patterns 121a. Accordingly, the plurality of lower unstretched lines 183a and the plurality of second lower stretched lines 182a may integrally function as a plurality of data lines.

Referring to FIG. 7B, a plurality of upper unstretched lines 183b are disposed on the upper plate pattern 121b. In addition, a plurality of first upper stretched lines 181b and a plurality of second upper stretched lines 182b are disposed on the plurality of upper line patterns 122b.

In addition, the plurality of respective upper unstretched lines 183b may extend in the first direction X and be connected to the plurality of first upper stretched lines 181b. For example, the plurality of upper unstretched lines 183b and the plurality of first upper stretched lines 181b may be integrally formed. Each of the plurality of first upper stretched lines 181b and each of the plurality of upper unstretched lines 183b may be formed of one conductive layer.

In addition, the low potential voltage VSS and the high potential voltage VDD are applied to the plurality of first upper stretched lines 181b. Accordingly, any one of the plurality of first upper stretched lines 181b may function as a low potential voltage line that transmits the low potential voltage VSS, and the other one of the first upper stretched lines 181b may function as a high potential voltage line that transmits the high potential voltage VDD. That is, the plurality of first upper stretched lines 181b may serve as voltage lines.

In addition, each of the plurality of first upper stretched lines 181b may be electrically connected to each other through each of the plurality of upper unstretched lines 183b disposed on the upper plate patterns 121b. Accordingly, the plurality of upper unstretched lines 183b and the plurality of first upper stretched lines 181b may integrally function as a high potential voltage line and a low potential voltage line.

In addition, the third data voltage Vdata_B and the reference voltage Vref are applied to the plurality of second upper stretched lines 182b. Accordingly, any one of the plurality of second upper stretched lines 182b may function as a third data line that transmits the third data voltage Vdata_B, and the other one of the plurality of second upper stretched lines 182b may function as a reference line that transmits the reference voltage Vref.

In addition, each of the plurality of second upper stretched lines 182b may be electrically connected to each other through a metal layer disposed under the plurality of second upper stretched lines 182b in the upper plate pattern 121b.

Figure 8:
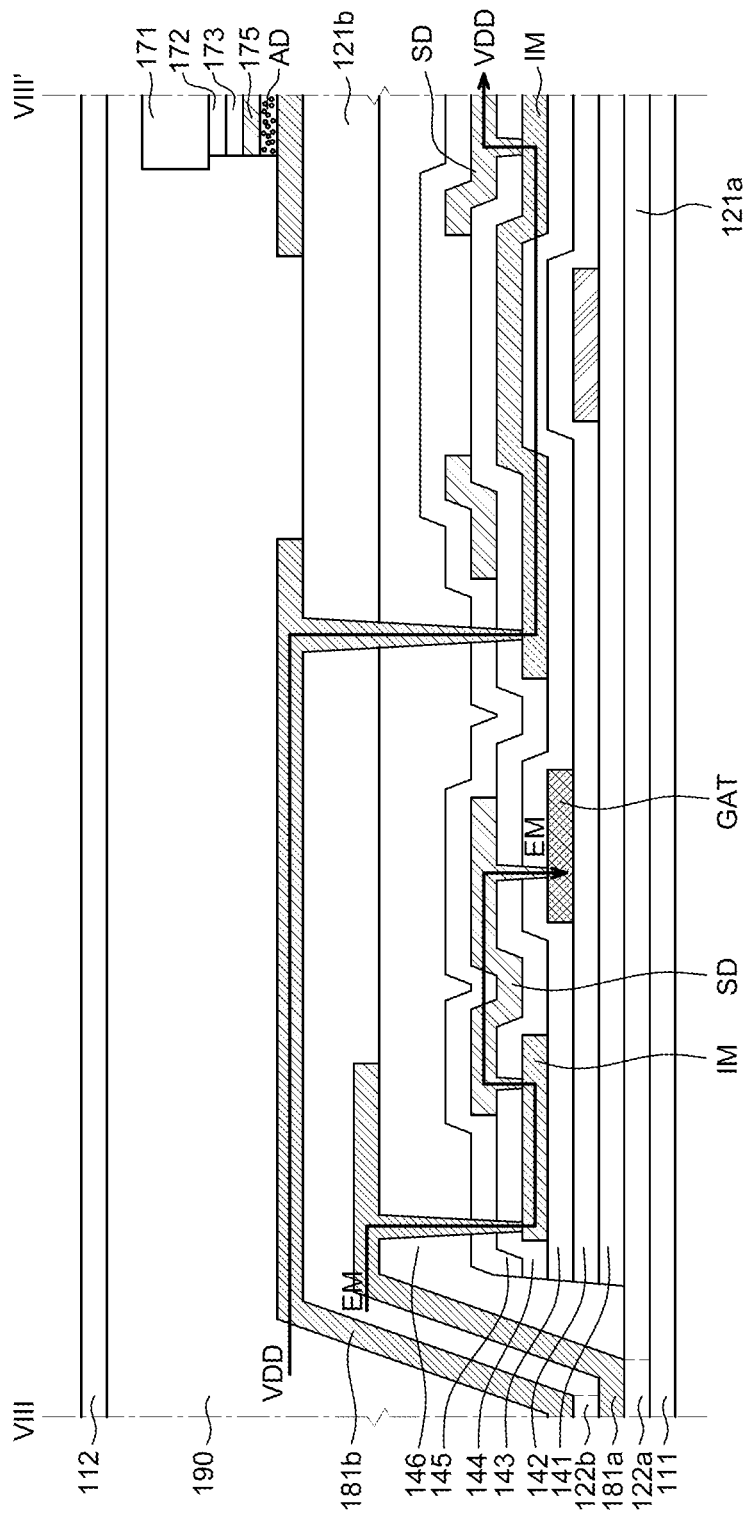
FIG. 8 is a cross-sectional view taken along cutting line VIII-VIII' shown in FIGS. 7A and 7B.
Figure 9:
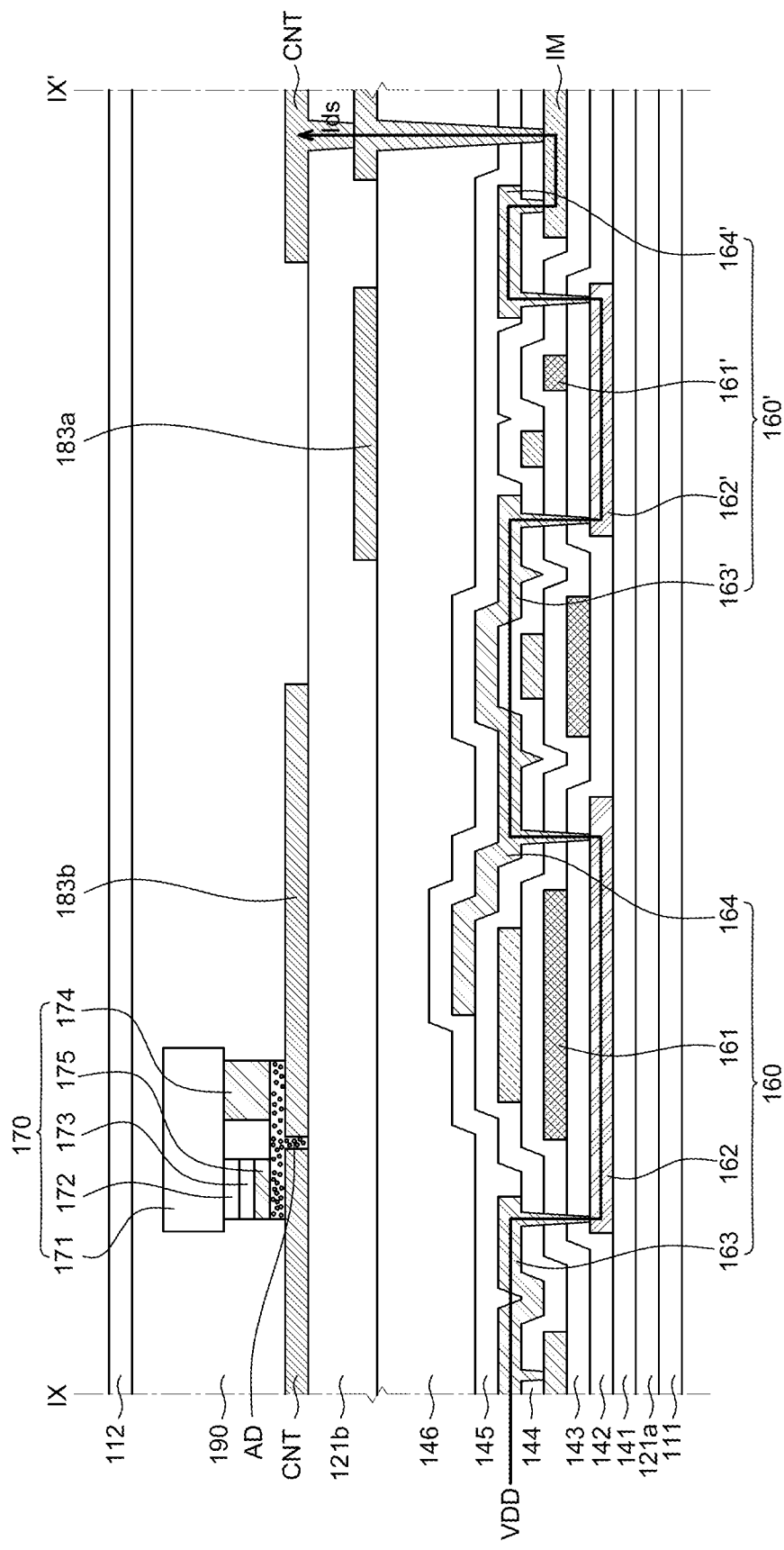
FIG. 9 is a cross-sectional view taken along cutting line IX-IX' shown in FIGS. 7A and 7B.

Hereinafter, cross-sectional views shown in FIGS. 8 and 9 will be described with reference to FIG. 3. FIGS. 8 and 9 illustrate a cross-sectional relationship between the driving transistor DT, the emission control transistor T4, and the light emitting element that are disposed between the high potential voltage line and the low potential voltage line shown in FIG. 6.

FIG. 8 is a cross-sectional view taken along cutting line VIII-VIII' shown in FIGS. 7A and 7B.

FIG. 9 is a cross-sectional view taken along cutting line IX-IX' shown in FIGS. 7A and 7B.

Specifically, FIG. 8 illustrates a cross-sectional structure in which the emission signal EM is applied to the gate electrode of the emission control transistor and a cross-sectional structure in which the high potential voltage VDD is applied to the source electrode of the driving transistor.

In FIG. 8, a layer in which the gate electrodes of the plurality of transistors are disposed is denoted as a gate layer GAT, and a layer in which the source electrodes and drain electrodes of the plurality of transistors are disposed is denoted as a source-drain layer SD.

Referring to FIG. 8, the first lower stretched line 181a is connected to the intermediate metal layer IM through a contact hole, the intermediate metal layer IM is connected to the source-drain layer SD through another contact hole, and the source-drain layer SD is connected to the gate layer GAT through still another contact hole. Accordingly, the emission signal EM transmitted through the first lower stretched line 181a may be applied to the gate electrode of the emission control transistor.

And, referring to FIG. 8, the first upper stretched line 181b is connected to the intermediate metal layer IM through a contact hole, and the intermediate metal layer IM is connected to the source-drain layer SD through another contact hole. Accordingly, the high potential voltage VDD transmitted through the first upper stretched line 181b may be applied to the source electrode of the driving transistor.

And, referring to FIG. 9, the driving transistor 160 and an emission control transistor 160' are electrically connected. In addition, the emission control transistor 160' and the first connection pad CNT1 may be electrically connected.

Specifically, the drain electrode 164 of the driving transistor 160 and a source electrode 163' of the emission control transistor 160' may be connected. For example, as shown in FIG. 9, the drain electrode 164 of the driving transistor 160 and the source electrode 163' of the emission control transistor 160' may be integrally formed. In other words, referring to FIG. 6, the drain electrode 164 of the driving transistor 160 and the source electrode 163' of the emission control transistor 160' may be connected to the third node N3.

Also, a drain electrode 164' of the emission control transistor 160' may be connected to the first connection pad CNT1 through the intermediate metal layer IM. More specifically, the drain electrode 164' of the emission control transistor 160' may be connected to the intermediate metal layer IM through a contact hole, and the intermediate metal layer IM may be connected to the first connection pad CNT1 through another contact hole. In other words, referring to FIG. 6, the drain electrode 164' of the emission control transistor 160' and the first connection pad CNT1 may be connected to a fourth node N4.

Accordingly, according to a voltage that is applied to the gate electrode 161 of the driving transistor 160, a driving current Ids that flows through the source electrode 163, the active layer 162, and the drain electrode 164 of the driving transistor 160 is determined. And, when the emission signal EM of a turn-on level is applied to a gate electrode 161' of the emission control transistor 160', the driving current Ids is transmitted to the first connection pad CNT1 through the source electrode 163', the active layer 162' and the drain electrode 164' of the emission control transistor 160'.

Accordingly, a driving voltage due to the driving current Ids is applied to the n-electrode 174, and the low potential voltage VSS is applied to the p-electrode 175 from the upper unstretched line 183b, so that the light emitting element may emit light.

As described above, the display device according to an example embodiment of the present disclosure may include the plurality of lower lines disposed on the lower pattern layer and the plurality of upper lines disposed on the upper pattern layer.

Accordingly, lines for driving the display device may not be disposed on only one plane, but may be disposed on a plurality of planes.

For example, in a conventional display device, four stretched lines should be disposed on only one pattern layer, whereas in the display device according to an example embodiment of the present disclosure, only two stretched lines are disposed on each of two pattern layers, so that a total of four stretched lines can be disposed.

That is, in a predetermined area based on an upper surface, four stretched lines should be disposed in a conventional display device, whereas only two stretched lines may be disposed in the display device according to an example embodiment of the present disclosure. Accordingly, it is possible to secure a larger gap between the stretched lines disposed in the display device according to an example embodiment of the present disclosure. For this reason, when the stretched lines are stretched, the probability that the stretched line is damaged due to adjacent stretched lines is remarkably reduced, so that stretching reliability can be improved.

In addition, in the display device according to an example embodiment of the present disclosure, the upper stretched line and the upper unstretched line are separately formed, and a high potential voltage and a low potential voltage, which are constant power supplies, are applied thereto.

In a conventional display device, a high potential voltage line is formed in a line layer in which a gate line and a data line are formed. Accordingly, a line resistance of the high potential voltage line is relatively increased, so that a difference between levels of the high potential voltage that are applied to a pixel disposed at an edge of a display panel and a pixel disposed at a center of the display panel is about 1.66V.

Unlike this, in the display device according to an example embodiment of the present disclosure, the upper stretched line and the upper unstretched line are separately formed and used as the high potential voltage lines. Accordingly, the line resistance of the high potential voltage line is relatively decreased, so that a difference between levels of the high potential voltage that are applied to a pixel disposed at an edge of a display panel and a pixel disposed at a center of the display panel is reduced to about 0.75V.

Accordingly, in the display device according to an example embodiment of the present disclosure, uniformity of an image may be improved by reducing variations in high potential voltage that are supplied to the plurality of pixels.

Also, in the display device according to an example embodiment of the present disclosure, the lower stretched line and the lower unstretched line may be used only as the gate line and the data line except for the high potential voltage line. Accordingly, line resistances of the gate line and the data line are relatively reduced, thereby minimizing a signal delay of the gate signal and the data voltage.

Hereinafter, a display device according to another example embodiment of the present disclosure will be described.

Since there are differences between the display device according to another example embodiment of the present disclosure and the display device according to an example embodiment of the present disclosure only in terms of lower unstretched lines, descriptions will be made with focus on this.

The same reference numerals are used for the same components of the display device according to another example embodiment of the present disclosure and the display device according to an example embodiment of the present disclosure.

Another Example Embodiment of the Present Disclosure

Figure 10A:
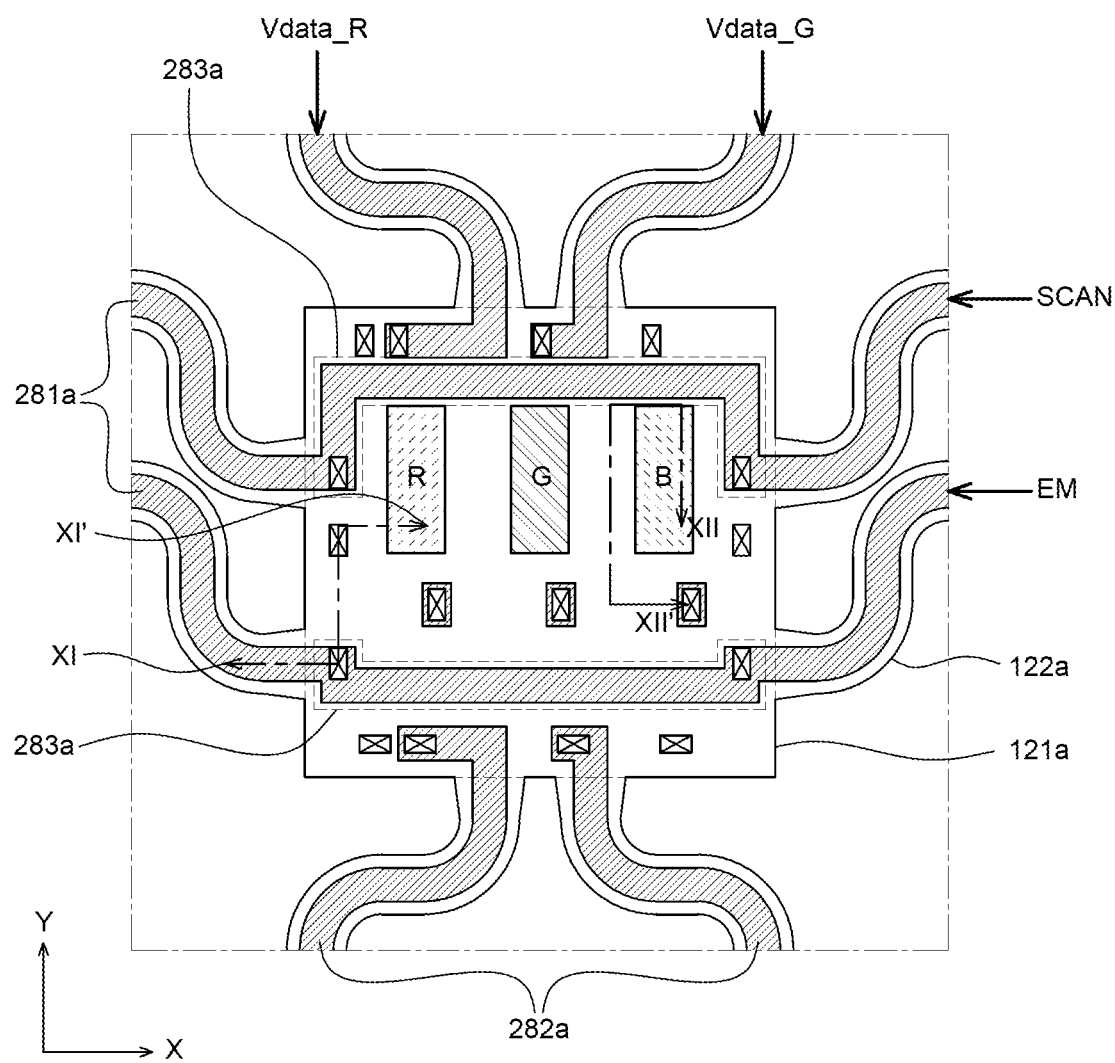
FIG. 10A is a view illustrating an arrangement relationship of a lower stretched line and a lower unstretched line of a display device according to another example embodiment of the present disclosure.

FIG. 10A is a view illustrating an arrangement relationship of a lower stretched line and a lower unstretched line of a display device according to another example embodiment of the present disclosure.

Figure 10B:
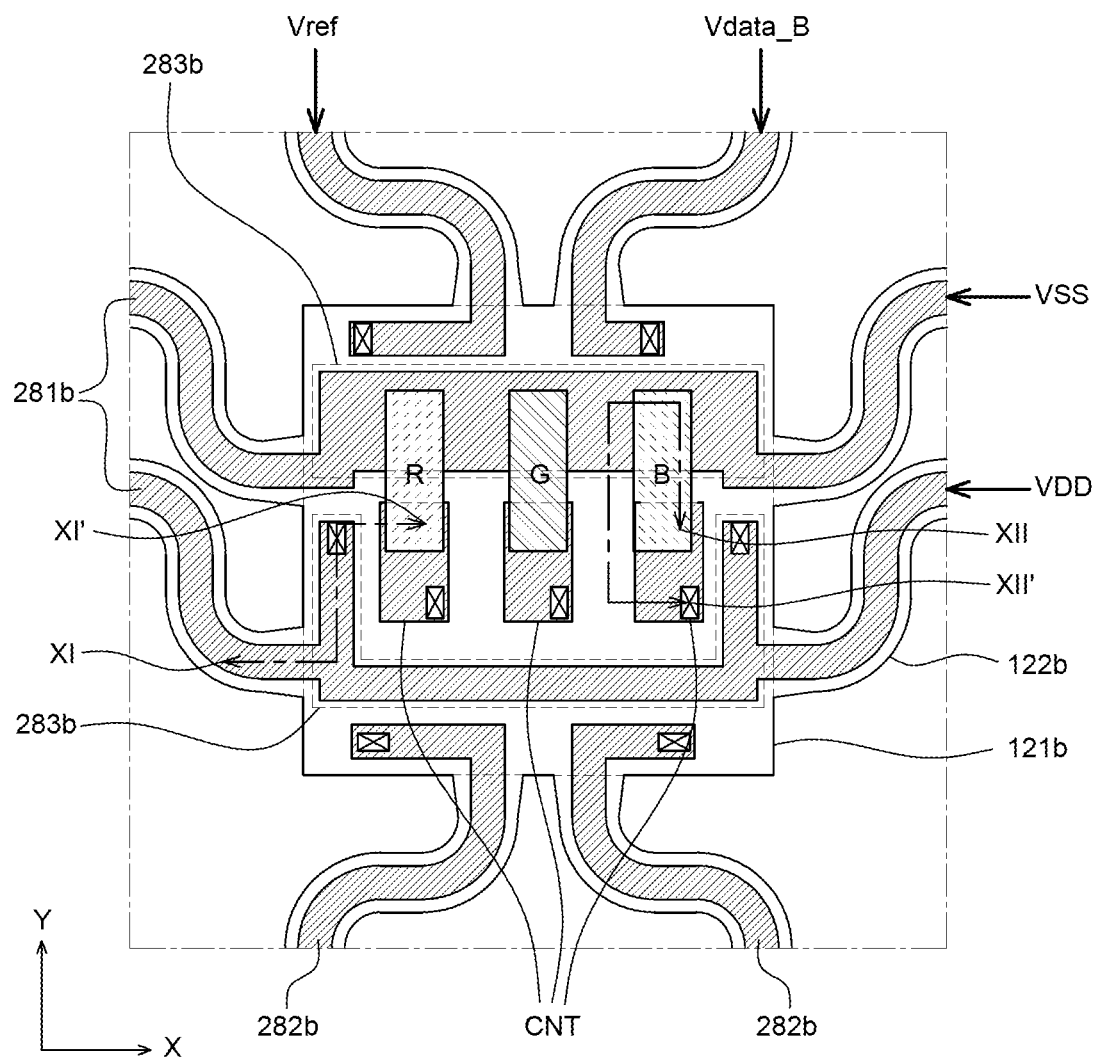
FIG. 10B is a view illustrating an arrangement relationship of an upper stretched line and an upper unstretched line of the display device according to another example embodiment of the present disclosure.

FIG. 10B is a view illustrating an arrangement relationship of an upper stretched line and an upper unstretched line of the display device according to another example embodiment of the present disclosure.

The arrangement relationship of the lower stretched line and the lower unstretched line illustrated in FIG. 10A and the arrangement relationship of the upper stretched line and the upper unstretched line illustrated in FIG. 10B may overlap in a direction in which they are perpendicular to each other on an X-Y plane.

Hereinafter, for convenience of explanation, the light emitting element 170 will be described as a plurality of light emitting elements R, G, and B. The data voltages Vdata may include a first data voltage Vdata_R which is input to a red light emitting element R, a second data voltage Vdata_G which is input to a green light emitting element G, and a third data voltage Vdata_B which is input to a blue light emitting element B.

Referring to FIG. 10A, a plurality of lower unstretched lines 283a are disposed on the lower plate pattern 121a. In addition, a plurality of first lower stretched lines 281a and a plurality of second lower stretched lines 282a are disposed on the plurality of lower line patterns 122a.

In addition, the plurality of respective lower unstretched lines 283a may extend in the first direction X and be connected to the plurality of first lower unstretched lines 281a. For example, the plurality of lower unstretched lines 283a and the plurality of first lower stretched lines 281a may be integrally formed. Each of the plurality of first lower stretched lines 281a and each of the plurality of lower unstretched lines 283a may be formed of one conductive layer.

In addition, the scan signal SCAN and the emission signal EM are applied to the plurality of first lower stretched lines 281a. Accordingly, one of the plurality of first lower stretched lines 281a may function as a scan signal line that transmits the scan signal SCAN, and the other one of the plurality of first lower stretched lines 281a may function as an emission signal line that transmits the emission signal EM. That is, the plurality of first lower stretched lines 281a may serve as gate lines.

In addition, each of the plurality of first lower stretched lines 281a may be electrically connected to each other through each of the plurality of lower unstretched lines 283a disposed on the lower plate pattern 121a. Accordingly, the plurality of lower unstretched lines 283a and the plurality of first lower stretched lines 281a may integrally function as a plurality of gate lines.

In addition, the first data voltage Vdata_R and the second data voltage Vdata_G are applied to the plurality of second lower stretched lines 282a. Accordingly, one of the plurality of second lower stretched lines 282a may function as a first data line that transmits the first data voltage Vdata_R, and the other one of the plurality of second lower stretched lines 282a may function as a second data line that transmits the second data voltage Vdata_G. That is, the plurality of second lower stretched lines 282a may serve as a plurality of data lines.

In addition, each of the plurality of second lower stretched lines 282a may be electrically connected to each other through a metal layer disposed under the plurality of second lower stretched lines 282a in the lower plate pattern 121a.

Referring to FIG. 10B, a plurality of upper unstretched lines 283b are disposed on the upper plate pattern 121b. In addition, a plurality of first upper stretched lines 281b and a plurality of second upper stretched lines 282b are disposed on the plurality of upper line patterns 122b.

In addition, the plurality of respective upper unstretched lines 283b may extend in the first direction X and be connected to the plurality of first upper unstretched lines 281b. For example, the plurality of upper unstretched lines 283b and the plurality of first upper stretched lines 281b may be integrally formed. Each of the plurality of first upper stretched lines 281b and each of the plurality of upper unstretched lines 283b may be formed of one conductive layer.

In addition, the low potential voltage VSS and the high potential voltage VDD are applied to the plurality of first upper stretched lines 281b. Accordingly, any one of the plurality of first upper stretched lines 281b may function as a low potential voltage line that transmits the low potential voltage VSS, and the other one of the first upper stretched lines 281b may function as a high potential voltage line that transmits the high potential voltage VDD. That is, the plurality of first upper stretched lines 281b may serve as voltage lines.

In addition, each of the plurality of first upper stretched lines 281b may be electrically connected to each other through each of the plurality of upper unstretched lines 283b disposed on the upper plate patterns 121b. Accordingly, the plurality of upper unstretched lines 283b and the plurality of first upper stretched lines 281b may integrally function as high potential voltage lines and low potential voltage lines.

In addition, the third data voltage Vdata_B and the reference voltage Vref are applied to the plurality of second upper stretched lines 282b. Accordingly, any one of the plurality of second upper stretched lines 282b may function as a third data line that transmits the third data voltage Vdata_B, and the other one of the plurality of second upper stretched lines 282b may function as a reference line that transmits the reference voltage Vref.

In addition, each of the plurality of second upper stretched lines 282b may be electrically connected to each other through a metal layer disposed under the plurality of second upper stretched lines 282b in the upper plate pattern 121b.

Figure 11:
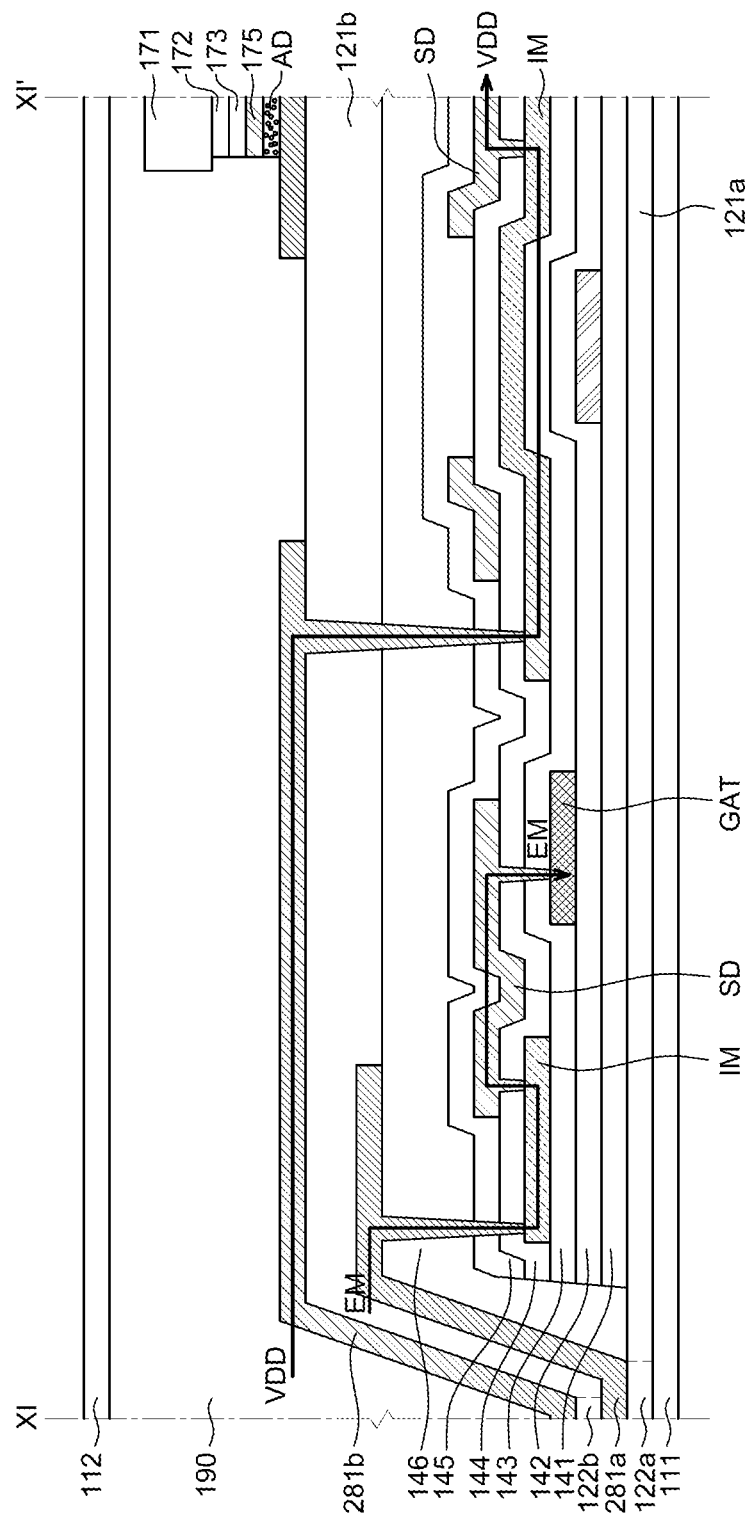
FIG. 11 is a cross-sectional view taken along cutting line XI-XI' shown in FIGS. 10A and 10B.
Figure 12:
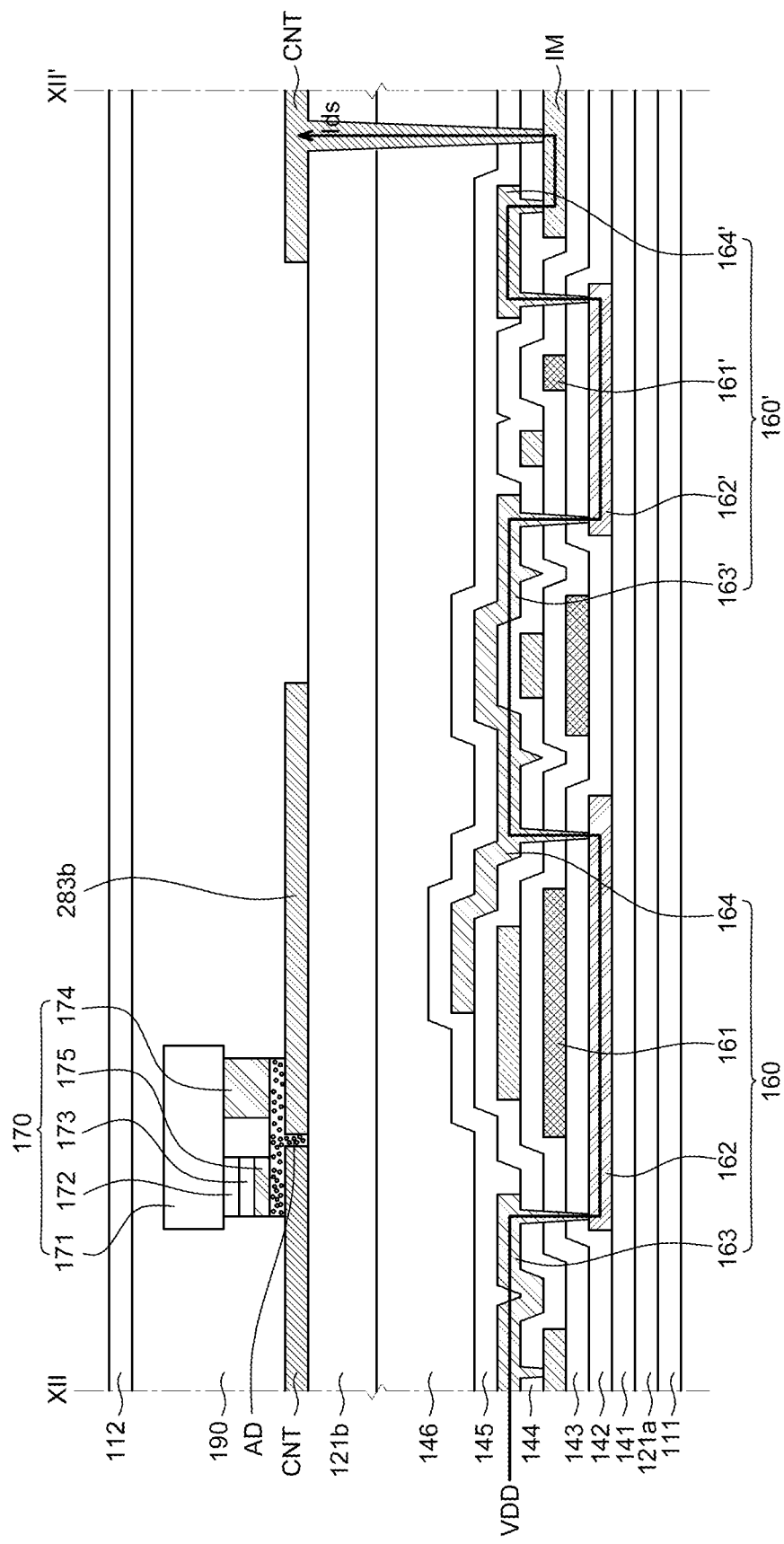
FIG. 12 is a cross-sectional view taken along cutting line XII-XII' shown in FIGS. 10A and 10B.

Hereinafter, cross-sectional views shown in FIGS. 11 and 12 will be described with reference to FIG. 3. FIGS. 11 and 12 illustrate a cross-sectional relationship between the driving transistor DT, the emission control transistor T4, and the light emitting element disposed between the high potential voltage line and the low potential voltage line shown in FIG. 6.

FIG. 11 is a cross-sectional view taken along cutting line XI-XI' shown in FIGS. 10A and 10B.

FIG. 12 is a cross-sectional view taken along cutting line XII-XII' shown in FIGS. 10A and 10B.

Specifically, FIG. 11 illustrates a cross-sectional structure in which the emission signal EM is applied to the gate electrode of the emission control transistor and a cross-sectional structure in which the high potential voltage VDD is applied to the source electrode of the driving transistor.

In FIG. 11, a layer in which the gate electrodes of the plurality of transistors are disposed is denoted as a gate layer GAT, and a layer in which the source electrodes and drain electrodes of the plurality of transistors are disposed is denoted as a source-drain layer SD.

Referring to FIG. 11, the first lower stretched line 281a is connected to the intermediate metal layer IM through a contact hole, the intermediate metal layer IM is connected to the source-drain layer SD through another contact hole, and the source-drain layer SD is connected to the gate layer GAT through still another contact hole. Accordingly, the emission signal EM transmitted through the first lower stretched line 281a may be applied to the gate electrode of the emission control transistor.

And, referring to FIG. 11, the first upper stretched line 281b is connected to the intermediate metal layer IM through a contact hole, and the intermediate metal layer IM is connected to the source-drain layer SD through another contact hole. Accordingly, the high potential voltage VDD transmitted through the first upper stretched line 281b may be applied to the source electrode of the driving transistor.

And, referring to FIG. 12, the driving transistor 160 and the emission control transistor 160' are electrically connected. In addition, the emission control transistor 160' and the first connection pad CNT1 may be electrically connected.

Specifically, the drain electrode 164 of the driving transistor 160 and the source electrode 163' of the emission control transistor 160' may be connected. For example, as shown in FIG. 12, the drain electrode 164 of the driving transistor 160 and the source electrode 163' of the emission control transistor 160' may be integrally formed. In other words, referring to FIG. 6, the drain electrode 164 of the driving transistor 160 and the source electrode 163' of the emission control transistor 160' may be connected to the third node N3.

Also, the drain electrode 164 of the emission control transistor 160' may be connected to the first connection pad CNT1 through the intermediate metal layer IM. More specifically, the drain electrode 164' of the emission control transistor 160' may be connected to the intermediate metal layer IM through a contact hole, and the intermediate metal layer IM may be connected to the first connection pad CNT1 through another contact hole. In other words, referring to FIG. 6, the drain electrode 164' of the emission control transistor 160' and the first connection pad CNT1 may be connected to the fourth node N4.

Accordingly, according to a voltage that is applied to the gate electrode 161 of the driving transistor 160, a driving current Ids that flows through the source electrode 163, the active layer 162, and the drain electrode 164 of the driving transistor 160 is determined. And, when the emission signal EM of a turn-on level is applied to the gate electrode 161' of the emission control transistor 160', the driving current Ids is transmitted to the first connection pad CNT1 through the source electrode 163', the active layer 162' and the drain electrode 164' of the emission control transistor 160'.

Accordingly, a driving voltage due to the driving current Ids is applied to the n-electrode 174, and the low potential voltage VSS is applied to the p-electrode 175 from the upper unstretched line 283b, so that the light emitting element may emit light.

As described above, the display device according to another example embodiment may also include the plurality of lower lines disposed on the lower pattern layer and the plurality of upper lines disposed on the upper pattern layer.

As described above, the display device according to another example embodiment of the present disclosure can also secure a larger gap between stretched lines, so that stretching reliability can be improved.

Also, in the display device according to another example embodiment of the present disclosure, uniformity of an image may be improved by reducing variations in high potential voltage that are supplied to the plurality of pixels.

Also, in the display device according to another example embodiment of the present disclosure, line resistances of the gate line and the data line are relatively reduced, so that the signal delay of the gate signal and the data voltage can be minimized.

Hereinafter, a display device according to still another example embodiment of the present disclosure will be described.

There are differences between the display device according to still another example embodiment of the present disclosure and the display device according to an example embodiment of the present disclosure in terms of the number and shape of stretched lines and the number and shape of unstretched lines.

The same reference numerals are used for the same components of the display device according to still another example embodiment of the present disclosure and the display device according to an example embodiment of the present disclosure.

Another Example Embodiment of the Present Disclosure

Figure 13A:
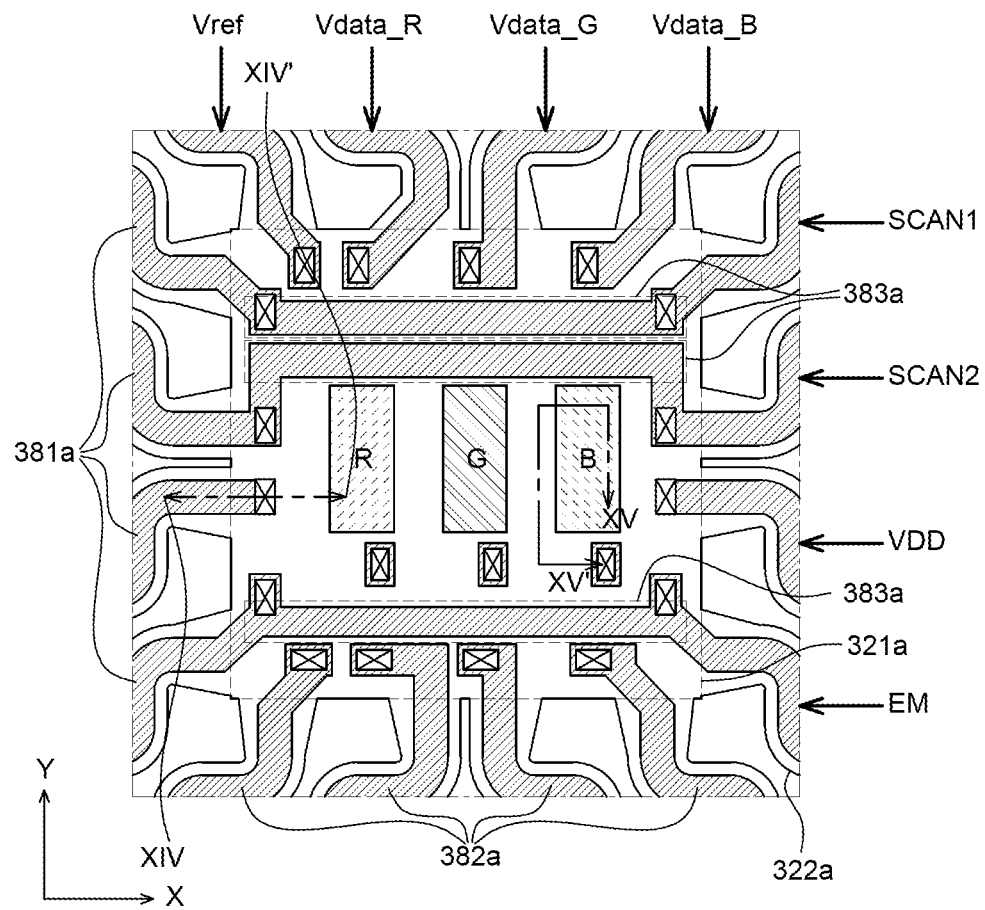
FIG. 13A is a view illustrating an arrangement relationship of a lower stretched line and a lower unstretched line of a display device according to still another example embodiment of the present disclosure.

FIG. 13A is a view illustrating an arrangement relationship of a lower stretched line and a lower unstretched line of a display device according to still another example embodiment of the present disclosure.

Figure 13B:
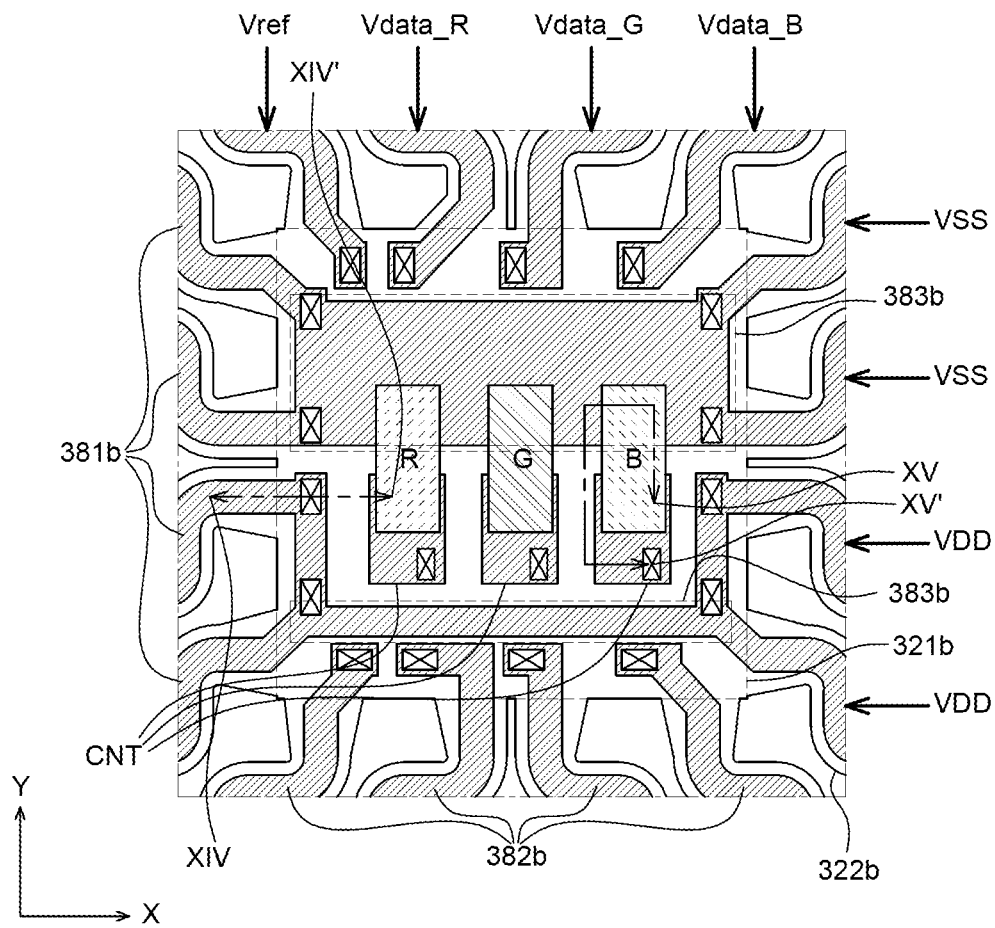
FIG. 13B is a view illustrating an arrangement relationship of an upper stretched line and an upper unstretched line of the display device according to still another example embodiment of the present disclosure.

FIG. 13B is a view illustrating an arrangement relationship of an upper stretched line and an upper unstretched line of the display device according to still another example embodiment of the present disclosure.

The arrangement relationship of the lower stretched line and the lower unstretched line illustrated in FIG. 13A and the arrangement relationship of the upper stretched line and the upper unstretched line illustrated in FIG. 13B may overlap in a direction in which they are perpendicular to each other on an X-Y plane.

Hereinafter, for convenience of explanation, the light emitting element 170 will be described as a plurality of light emitting elements R, G, and B. The data voltages Vdata may include a first data voltage Vdata_R which is input to a red light emitting element R, a second data voltage Vdata_G which is input to a green light emitting element G, and a third data voltage Vdata_B which is input to a blue light emitting element B.

Referring to FIG. 13A, a plurality of lower unstretched lines 383a are disposed on the lower plate pattern 321a. In addition, a plurality of first lower stretched lines 381a and a plurality of second lower stretched lines 382a are disposed on the plurality of lower line patterns 322a.

In addition, the plurality of respective lower unstretched lines 383a may extend in the first direction X and be connected to the plurality of first lower stretched lines 381a. For example, the plurality of lower unstretched lines 383a and the plurality of first lower stretched lines 381a may be integrally formed. Each of the plurality of first lower stretched lines 381a and each of the plurality of lower unstretched lines 383a may be formed of one conductive layer.

In addition, the plurality of scan signals SCAN1 and SCAN2, the high potential voltage VDD and the emission signal EM are applied to the plurality of first lower stretched lines 381a. Accordingly, one of the plurality of first lower stretched lines 381a may function as a scan signal line that transmits any one of the plurality of scan signals SCAN1. In addition, another one of the plurality of first lower stretched lines 381a may function as a scan signal line that transmits the other one of the plurality of scan signals SCAN2. In addition, still another one of the plurality of first lower stretched lines 381a may function as a high potential voltage line that transmits the high potential voltage VDD. A reminder one of the plurality of first lower stretched lines 381a may function as an emission signal line that transmits the emission signal EM. That is, each of the plurality of first lower stretched lines 381a may serve as a gate line and a high potential voltage line.

In addition, each of the plurality of first lower stretched lines 381a may be electrically connected to each other through each of the plurality of lower unstretched lines 383a disposed on the lower plate pattern 321a. Accordingly, the plurality of lower unstretched lines 383a and the plurality of first lower stretched lines 381a may integrally function as a gate line and a high potential voltage line.

In addition, each of the plurality of data voltages Vdata_R, Vdata_G, and Vdata_B and the reference voltage Vref are applied to the plurality of second lower stretched lines 382a. Accordingly, any one of the plurality of second lower stretched lines 382a may function as a first data line that transmits the first data voltage Vdata_R. In addition, another one of the plurality of second lower stretched lines 382a may function as a second data line that transmits the second data voltage Vdata_G. In addition, still another one of the plurality of second lower stretched lines 382a may function as a third data line that transmits the third data voltage Vdata_B. In addition, a reminder one of the plurality of second lower stretched lines 382a may function as a reference line that transmits the reference voltage Vref. That is, each of the plurality of second lower stretched lines 382a may serve as a plurality of data lines and a reference line.

In addition, each of the plurality of second lower stretched lines 382a may be electrically connected to each other through a metal layer disposed under the plurality of second lower stretched lines 382a in the lower plate pattern 321a.

Referring to FIG. 13B, a plurality of upper unstretched lines 383b are disposed on the upper plate pattern 321b. In addition, a plurality of first upper stretched lines 381b and a plurality of second upper stretched lines 382b are disposed on the plurality of upper line patterns 322b.

In addition, the plurality of respective upper unstretched lines 383b may extend in the first direction X and be connected to the plurality of first upper unstretched lines 381b. For example, the plurality of upper unstretched lines 383b and the plurality of first upper stretched lines 381b may be integrally formed. Each of the plurality of first upper stretched lines 381b and each of the plurality of upper unstretched lines 383b may be formed of one conductive layer.

In addition, the low potential voltage VSS and the high potential voltage VDD are applied to the plurality of first upper stretched lines 381b. Accordingly, any one pair of the plurality of first upper stretched lines 381b may function as a low potential voltage line that transmits the low potential voltage VSS, and the other pair of the first upper stretched lines 381b may function as a high potential voltage line that transmits the high potential voltage VDD. That is, the plurality of first upper stretched lines 381b may serve as voltage lines.

In addition, each of the plurality of first upper stretched lines 381b may be electrically connected to each other through each of the plurality of upper unstretched lines 383b disposed on the upper plate patterns 321b. Accordingly, the plurality of upper unstretched lines 383b and the plurality of first upper stretched lines 381b may integrally function as a high potential voltage line and a low potential voltage line.

In addition, each of the plurality of data voltages Vdata_R, Vdata_G, and Vdata_B and the reference voltage Vref are applied to the plurality of second upper stretched lines 382b. Accordingly, any one of the plurality of second upper stretched lines 382b may function as a first data line that transmits the first data voltage Vdata_R. In addition, another one of the plurality of second upper stretched lines 382b may function as a second data line that transmits the second data voltage Vdata_G. In addition, still another one of the plurality of second upper stretched lines 382b may function as a third data line that transmits the third data voltage Vdata_B. In addition, a reminder one of the plurality of second upper stretched lines 382b may function as a reference line that transmits the reference voltage Vref. That is, each of the plurality of second upper stretched lines 382b may serve as a plurality of data lines and a reference line.

In addition, each of the plurality of second upper stretched lines 382b may be electrically connected to each other through a metal layer disposed on the plurality of second upper stretched lines 382b in the upper plate pattern 321b.

Figure 14:
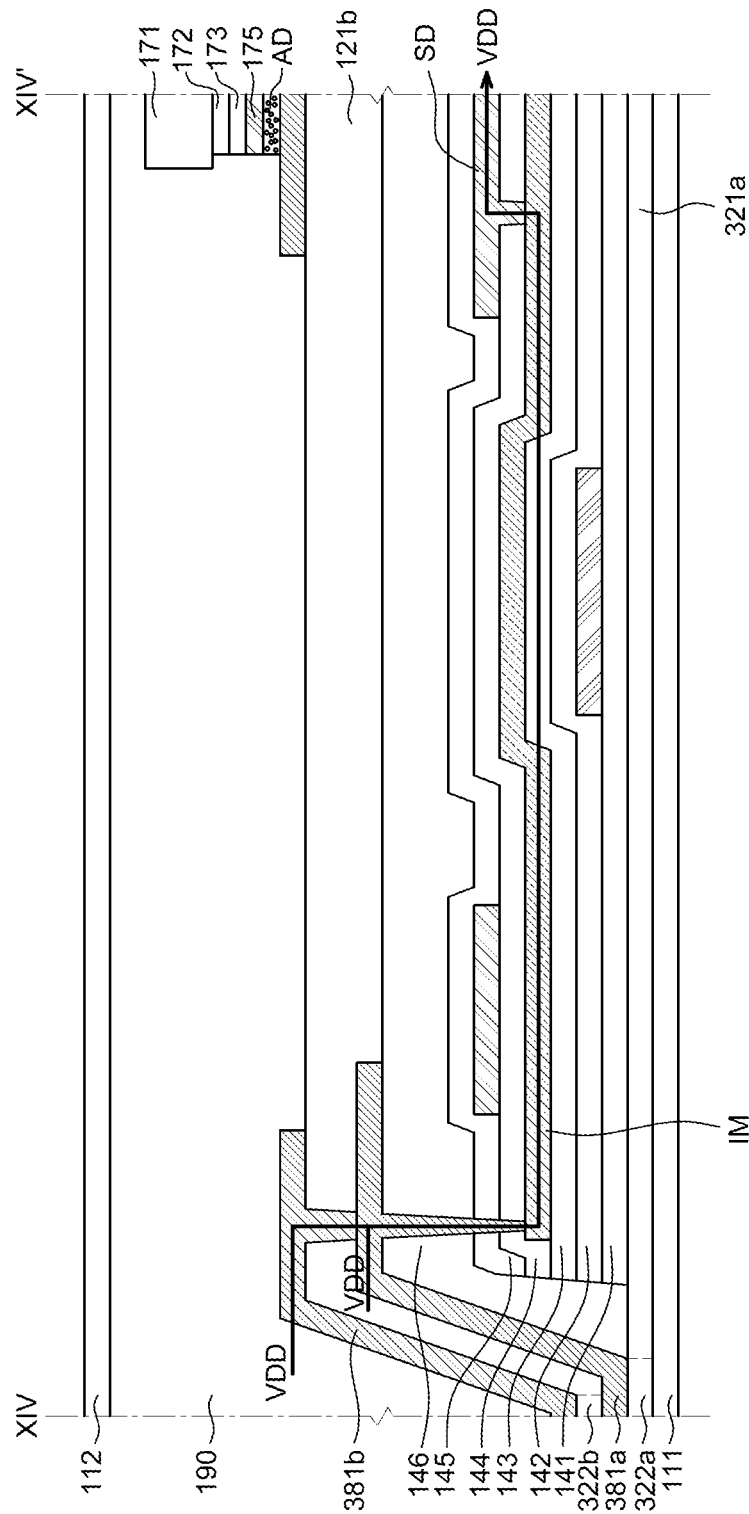
FIG. 14 is a cross-sectional view taken along cutting line VIII-VIII' shown in FIGS. 13A and 13B.
Figure 15:
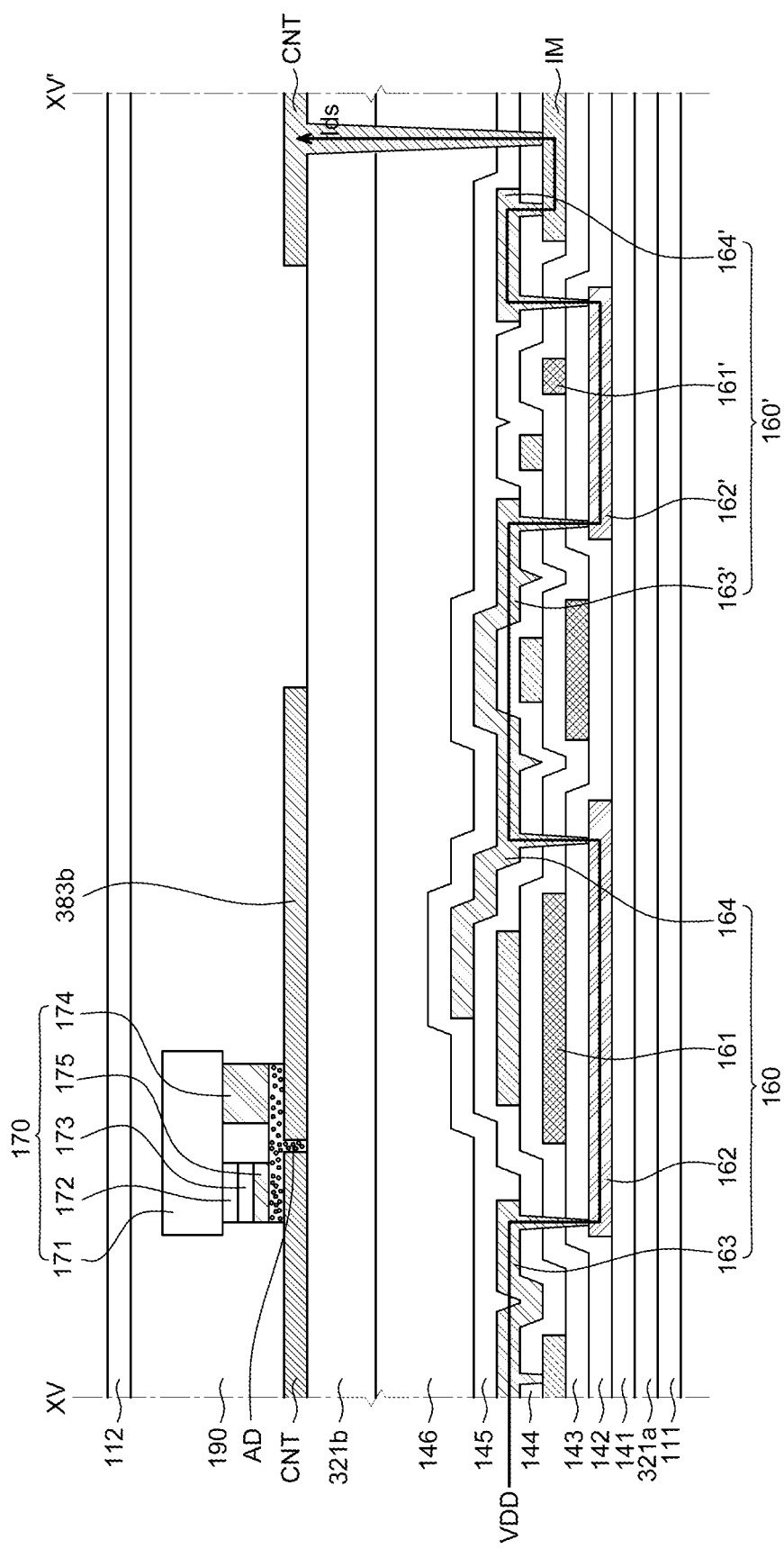
FIG. 15 is a cross-sectional view taken along cutting line IX-IX' shown in FIGS. 13A and 13B.

Hereinafter, cross-sectional views shown in FIGS. 14 and 15 will be described with reference to FIG. 3. FIGS. 14 and 15 illustrate a cross-sectional relationship between the driving transistor DT, the emission control transistor T4, and the light emitting element disposed between the high potential voltage line and the low potential voltage line shown in FIG. 6.

FIG. 14 is a cross-sectional view taken along cutting line VIII-VIII' shown in FIGS. 13A and 13B.

FIG. 15 is a cross-sectional view taken along cutting line IX-IX' shown in FIGS. 13A and 13B.

Specifically, FIG. 14 illustrates a cross-sectional structure in which the emission signal EM is applied to the gate electrode of the emission control transistor and a cross-sectional structure in which the high potential voltage VDD is applied to the source electrode of the driving transistor.

In FIG. 14, a layer in which the gate electrodes of the plurality of transistors are disposed is denoted as a gate layer GAT, and a layer in which the source electrodes and drain electrodes of the plurality of transistors are disposed is denoted as a source-drain layer SD.

And, referring to FIG. 14, the first upper stretched line 381b is connected to the first lower stretched line 381a through a contact hole, the first lower stretched line 381a is connected to the intermediate metal layer IM through the contact hole, and the intermediate metal layer IM is connected to the source-drain layer SD through another contact hole. Accordingly, the high potential voltage VDD transmitted through the first upper stretched line 381b and the first lower stretched line 381a may be applied to the source electrode of the driving transistor.

And, referring to FIG. 15, the driving transistor 160 and the emission control transistor 160' are electrically connected. In addition, the emission control transistor 160' and the first connection pad CNT1 may be electrically connected.

Specifically, the drain electrode 164 of the driving transistor 160 and the source electrode 163' of the emission control transistor 160' may be connected. For example, as shown in FIG. 15, the drain electrode 164 of the driving transistor 160 and the source electrode 163' of the emission control transistor 160' may be integrally formed. In other words, referring to FIG. 6, the drain electrode 164 of the driving transistor 160 and the source electrode 163' of the emission control transistor 160' may be connected to the third node N3.

Also, the drain electrode 164' of the emission control transistor 160' may be connected to the first connection pad CNT1 through the intermediate metal layer IM. More specifically, the drain electrode 164' of the emission control transistor 160' may be connected to the intermediate metal layer IM through a contact hole, and the intermediate metal layer IM may be connected to the first connection pad CNT1 through another contact hole. In other words, referring to FIG. 6, the drain electrode 164' of the emission control transistor 160' and the first connection pad CNT1 may be connected to the fourth node N4.

Accordingly, according to a voltage that is applied to the gate electrode 161 of the driving transistor 160, a driving current Ids that flows through the source electrode 163, the active layer 162, and the drain electrode 164 of the driving transistor 160 is determined. And, when the emission signal EM of a turn-on level is applied to a gate electrode 161' of the emission control transistor 160', the driving current Ids is transmitted to the first connection pad CNT1 through the source electrode 163', the active layer 162' and the drain electrode 164' of the emission control transistor 160'.

Accordingly, a driving voltage due to the driving current Ids is applied to the n-electrode 174, and the low potential voltage VSS is applied to the p-electrode 175 from the upper unstretched line 383*b*, so that the light emitting element may emit light.

As described above, the display device according to still another example embodiment may also include a plurality of lower lines disposed on the lower pattern layer and a plurality of upper lines disposed on the upper pattern layer.

As described above, in the display device according to still another example embodiment of the present disclosure, uniformity of an image may be improved by reducing variations in high potential voltage that are supplied to the plurality of pixels.

Also, in the display device according to still another example embodiment of the present disclosure, line resistances of the gate line and the data line are relatively reduced, so that the signal delay of the gate signal and the data voltage can be minimized.

In addition, in the display device according to still another example embodiment of the present disclosure, a larger number of stretched lines may be disposed compared to a case in the display device according to an example embodiment of the present disclosure. Accordingly, in the display device according to still another example embodiment of the present disclosure, various signals such as a plurality of scan signals may be transmitted.

The example embodiments of the present disclosure can also be described as follows:

A display device according to an example embodiment of the present disclosure may include a stretchable lower substrate; a lower pattern layer disposed on the lower substrate and including a plurality of lower plate patterns and a plurality of lower line patterns; a plurality of pixel circuits disposed on each of the plurality of lower plate patterns; a plurality of lower stretched lines disposed on each of the plurality of lower line patterns; an upper pattern layer disposed on the lower pattern layer and including a plurality of upper plate patterns and a plurality of upper line patterns; a plurality of light emitting elements disposed on each of the plurality of upper plate patterns; and a plurality of upper stretched lines disposed on each of the plurality of upper line patterns, so that a uniform power may be supplied.

The display device may further comprise a plurality of lower unstretched lines disposed on each of the plurality of lower plate patterns and connecting the lower stretched lines; and a plurality of upper unstretched lines disposed on each of the plurality of upper plate patterns and connecting the upper stretched lines.

The plurality of lower stretched lines may include a plurality of first lower stretched lines extending in a first direction and a second lower stretched line extending in a second direction, the plurality of upper stretched lines may include a plurality of first upper stretched lines extending in the first direction and a second upper stretched line extending in the second direction.

Each of the plurality of pixel circuits may include a driving transistor configured to receive a high potential voltage to control a driving current applied to the light emitting element, a switching transistor configured to apply any one of a plurality of data voltages to each of the plurality of pixel circuits according to a scan signal, an initialization transistor configured to apply a reference voltage to the light emitting element according to the scan signal and an emission control transistor configured to form a current path between the driving transistor and the light emitting element according to an emission signal, the plurality of data voltages may include a first data voltage, a second data voltage, and a third data voltage.

The light emitting element may include an anode electrode connected to the emission control transistor and a cathode electrode connected to a low potential voltage line to which a low potential voltage is applied.

The driving transistor may include a source electrode connected to a high potential voltage line to which the high potential voltage is applied and a drain electrode connected to the emission control transistor, the switching transistor may include a source electrode connected to a data line to which any one of the plurality of data voltages is applied and a gate electrode connected to a scan signal line transmitting the scan signal, the initialization transistor may include a source electrode connected to a reference line to which the reference voltage is applied, a drain electrode connected to the anode electrode of the light emitting element, and a gate electrode connected to the scan signal line transmitting the scan signal, and the emission control transistor may include a source electrode connected to the driving transistor, a drain electrode connected to the light emitting element, and a gate electrode connected to an emission signal line transmitting the emission signal.

The scan signal and the emission signal may be applied to each of the plurality of first lower stretched lines, and the first data voltage and the second data voltage may be applied to each of the plurality of second lower stretched lines.

Each of the plurality of lower unstretched lines may extend in the second direction, and the first data voltage and the second data voltage may be applied to each of the plurality of lower unstretched lines.

Each of the plurality of second lower stretched lines and each of the plurality of lower unstretched lines may be formed of one conductive layer.

Each of the plurality of lower unstretched lines may extend in the first direction, and the scan signal and the emission signal may be applied to each of the plurality of lower unstretched lines.

Each of the plurality of first lower stretched lines and each of the plurality of lower unstretched lines may be formed of one conductive layer.

The high potential voltage and the low potential voltage may be applied to each of the plurality of first upper stretched lines, and the third data voltage and the reference voltage may be applied to each of the plurality of second upper stretched lines.

Each of the plurality of upper unstretched lines may extend in the first direction, and the high potential voltage and the low potential voltage may be applied to each of the plurality of upper unstretched lines.

Each of the plurality of first upper stretched lines and each of the plurality of upper unstretched lines may be formed of one conductive layer.

The scan signal, the emission signal, and the high potential voltage may be applied to each of the plurality of first lower stretched lines, and the plurality of data voltages and the reference voltage may be applied to each of the plurality of second lower stretched lines.

Each of the plurality of lower unstretched lines may extend in the first direction, and the scan signal and the emission signal may be applied to each of the plurality of lower unstretched lines.

Each of the plurality of first lower stretched lines and each of the plurality of lower unstretched lines may be formed of one conductive layer.

The high potential voltage and the low potential voltage may be applied to each of the plurality of first upper stretched lines, and the plurality of data voltages and the reference voltage may be applied to each of the plurality of second upper stretched lines.

Each of the plurality of upper unstretched lines may extend in the first direction, and the high potential voltage and the low potential voltage may be applied to each of the plurality of upper unstretched lines.

Each of the plurality of first upper stretched lines and each of the plurality of upper unstretched lines may be formed of one conductive layer.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a stretchable lower substrate;
   a lower pattern layer disposed on the stretchable lower substrate and including a plurality of lower plate patterns and a plurality of lower line patterns;
   a plurality of pixel circuits disposed on each of the plurality of lower plate patterns;
   a plurality of lower stretched lines disposed on each of the plurality of lower line patterns;
   an upper pattern layer disposed on the lower pattern layer and including a plurality of upper plate patterns and a plurality of upper line patterns;
   a plurality of light emitting elements disposed on each of the plurality of upper plate patterns; and
   a plurality of upper stretched lines disposed on each of the plurality of upper line patterns,
   wherein the plurality of lower stretched lines and the plurality of upper stretched lines are electrically insulated on the plurality of lower line patterns by the plurality of upper plate patterns and the plurality of upper line patterns.

2. The display device of claim 1, further comprising:
   a plurality of lower unstretched lines disposed on each of the plurality of lower plate patterns and connecting the lower stretched lines; and
   a plurality of upper unstretched lines disposed on each of the plurality of upper plate patterns and connecting the upper stretched lines.

3. The display device of claim 1,
   wherein the plurality of lower stretched lines includes a plurality of first lower stretched lines extending in a first direction and a second lower stretched line extending in a second direction,
   wherein the plurality of upper stretched lines includes a plurality of first upper stretched lines extending in the first direction and a second upper stretched line extending in the second direction.

4. The display device of claim 3, wherein each of the plurality of pixel circuits includes:
   a driving transistor configured to receive a high potential voltage to control a driving current applied to the light emitting element;
   a switching transistor configured to apply any one of a plurality of data voltages to each of the plurality of pixel circuits according to a scan signal;
   an initialization transistor configured to apply a reference voltage to the light emitting element according to the scan signal; and
   an emission control transistor configured to form a current path between the driving transistor and the light emitting element according to an emission signal,
   wherein the plurality of data voltages includes a first data voltage, a second data voltage, and a third data voltage.

5. The display device of claim 4, wherein the light emitting element includes an anode electrode connected to the emission control transistor and a cathode electrode connected to a low potential voltage line to which a low potential voltage is applied.

6. The display device of claim 5, wherein
   the driving transistor includes a source electrode connected to a high potential voltage line to which the high potential voltage is applied and a drain electrode connected to the emission control transistor;

the switching transistor includes a source electrode connected to a data line to which any one of the plurality of data voltages is applied and a gate electrode connected to a scan signal line transmitting the scan signal;

the initialization transistor includes a source electrode connected to a reference line to which the reference voltage is applied, a drain electrode connected to the anode electrode of the light emitting element, and a gate electrode connected to the scan signal line transmitting the scan signal; and the emission control transistor includes a source electrode connected to the driving transistor, a drain electrode connected to the light emitting element, and a gate electrode connected to an emission signal line transmitting the emission signal.

7. The display device of claim 5, wherein the scan signal and the emission signal are applied to each of the plurality of first lower stretched lines; and the first data voltage and the second data voltage are applied to each of the plurality of second lower stretched lines.

8. The display device of claim 7, wherein each of the plurality of lower unstretched lines extends in the second direction, and the first data voltage and the second data voltage are applied to each of the plurality of lower unstretched lines.

9. A display device comprising:

a stretchable lower substrate;

a lower pattern layer disposed on the stretchable lower substrate and including a plurality of lower plate patterns and a plurality of lower line patterns;

a plurality of pixel circuits disposed on each of the plurality of lower plate patterns;

a plurality of lower stretched lines disposed on each of the plurality of lower line Patterns;

an upper pattern layer disposed on the lower pattern layer and including a plurality of upper plate patterns and a plurality of upper line patterns;

a plurality of light emitting elements disposed on each of the plurality of upper plate patterns; and a plurality of upper stretched lines disposed on each of the plurality of upper line patterns the scan signal and the emission signal are applied to each of the plurality of first lower stretched lines; and the first data voltage and the second data voltage are applied to each of the plurality of second lower stretched lines, wherein the light emitting element includes an anode electrode connected to the emission control transistor and a cathode electrode connected to a low potential voltage line to which a low potential voltage is applied; and each of the plurality of second lower stretched lines and each of the plurality of lower unstretched lines are formed of one conductive layer.

10. A display device comprising:

a stretchable lower substrate;

a lower pattern layer disposed on the stretchable lower substrate and including a plurality of lower plate patterns and a plurality of lower line patterns;

a plurality of pixel circuits disposed on each of the plurality of lower plate patterns;

a plurality of lower stretched lines disposed on each of the plurality of lower line Patterns;

an upper pattern layer disposed on the lower pattern layer and including a plurality of upper plate patterns and a plurality of upper line patterns;

a plurality of light emitting elements disposed on each of the plurality of upper plate patterns; and a plurality of upper stretched lines disposed on each of the plurality of upper line patterns the scan signal and the emission signal are applied to each of the plurality of first lower stretched lines; and the first data voltage and the second data voltage are applied to each of the plurality of second lower stretched lines, wherein the light emitting element includes an anode electrode connected to the emission control transistor and a cathode electrode connected to a low potential voltage line to which a low potential voltage is applied; and wherein each of the plurality of lower unstretched lines extends in the first direction, and the scan signal and the emission signal are applied to each of the plurality of lower unstretched lines.

11. The display device of claim 10, wherein each of the plurality of first lower stretched lines and each of the plurality of lower unstretched lines are formed of one conductive layer.

12. The display device of claim 5, wherein the high potential voltage and the low potential voltage are applied to each of the plurality of first upper stretched lines; and the third data voltage and the reference voltage are applied to each of the plurality of second upper stretched lines.

13. The display device of claim 12, wherein each of the plurality of upper unstretched lines extends in the first direction, and the high potential voltage and the low potential voltage are applied to each of the plurality of upper unstretched lines.

14. The display device of claim 13, wherein each of the plurality of first upper stretched lines and each of the plurality of upper unstretched lines are formed of one conductive layer.

15. The display device of claim 5, wherein the scan signal, the emission signal, and the high potential voltage are applied to each of the plurality of first lower stretched lines; and the plurality of data voltages and the reference voltage are applied to each of the plurality of second lower stretched lines.

16. The display device of claim 15, wherein each of the plurality of lower unstretched lines extends in the first direction, and the scan signal and the emission signal are applied to each of the plurality of lower unstretched lines.

17. The display device of claim 16, wherein each of the plurality of first lower stretched lines and each of the plurality of lower unstretched lines are formed of one conductive layer.

18. The display device of claim 5, wherein the high potential voltage and the low potential voltage are applied to each of the plurality of first upper stretched lines; and the plurality of data voltages and the reference voltage are applied to each of the plurality of second upper stretched lines.

19. The display device of claim 18, wherein each of the plurality of upper unstretched lines extends in the first direction, and the high potential voltage and the low potential voltage are applied to each of the plurality of upper unstretched lines.

20. The display device of claim 19, wherein each of the plurality of first upper stretched lines and each of the plurality of upper unstretched lines are formed of one conductive layer.

* * * * *